(12) United States Patent
Bong et al.

(10) Patent No.: US 12,167,690 B2
(45) Date of Patent: Dec. 10, 2024

(54) THERMOELECTRIC MODULE AND POWER GENERATOR COMPRISING SAME

(71) Applicant: LG INNOTEK CO., LTD., Seoul (KR)

(72) Inventors: Sang Hoon Bong, Seoul (KR); Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/027,804

(22) PCT Filed: Sep. 17, 2021

(86) PCT No.: PCT/KR2021/012796
§ 371 (c)(1),
(2) Date: Mar. 22, 2023

(87) PCT Pub. No.: WO2022/065824
PCT Pub. Date: Mar. 31, 2022

(65) Prior Publication Data
US 2023/0345834 A1  Oct. 26, 2023

(30) Foreign Application Priority Data
Sep. 23, 2020 (KR) .......... 10-2020-0122963

(51) Int. Cl.
*H10N 10/17* (2023.01)
(52) U.S. Cl.
CPC .................. *H10N 10/17* (2023.02)
(58) Field of Classification Search
CPC .............................. H10N 10/00–857

USPC .................................. 136/200–242
See application file for complete search history.

(56) References Cited

U.S. PATENT DOCUMENTS

| | | | |
|---|---|---|---|
| 2012/0240596 A1* | 9/2012 | Okuda | F25B 21/04 62/3.2 |
| 2013/0037073 A1* | 2/2013 | LaGrandeur | H10N 10/13 136/224 |
| 2014/0230874 A1 | 8/2014 | Kushch | |
| 2014/0311543 A1* | 10/2014 | Jinushi | H10N 10/13 136/205 |
| 2018/0149061 A1 | 5/2018 | Barthelmes et al. | |
| 2021/0226112 A1 | 7/2021 | Lee et al. | |

FOREIGN PATENT DOCUMENTS

| | | |
|---|---|---|
| KR | 10-1428613 B1 | 8/2014 |
| KR | 10-2017-0011156 A | 2/2017 |
| KR | 10-2020-0005869 A | 1/2020 |
| KR | 10-2020-0015126 A | 2/2020 |

\* cited by examiner

*Primary Examiner* — Bach T Dinh
(74) *Attorney, Agent, or Firm* — Birch, Stewart, Kolasch & Birch, LLP

(57) ABSTRACT

Disclosed according to an embodiment of the present invention is a thermoelectric device comprising: a fluid flow part; a thermoelectric module disposed on the fluid flow part; a guide part disposed on the fluid flow part and spaced apart from the thermoelectric module; and a shield member disposed on the thermoelectric module, wherein a part of the guide part overlaps the shield member in the vertical direction.

10 Claims, 27 Drawing Sheets

(a)

(b)

THERMOELECTRIC MODULE AND POWER GENERATOR COMPRISING SAME

CROSS REFERENCE TO RELATED APPLICATIONS

This application is the National Phase of PCT/KR2021/012796 filed on Sep. 17, 2021, which claims priority under 35 U.S.C. § 119(a) to Patent Application No. 10-2020-0122963, filed in the Republic of Korea on Sep. 23, 2020, all of which are hereby expressly incorporated by reference into the present application.

TECHNICAL FIELD

The present invention relates to a thermoelectric module and a power generator including the same, and more particularly, to a thermoelectric module using a difference in temperature between a low-temperature part and a high temperature part of a thermoelectric element and a power generator including the same, or a thermoelectric device (in particular, a Seebeck device) for cooling or heating specific objects such as fluids.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are bonded between metal electrodes to form PN junction pairs.

The thermoelectric elements may be classified into elements which use a change in temperature of electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generation apparatuses, and the like. Accordingly, the demand for thermoelectric performance of the thermoelectric elements is gradually increasing.

Recently, there are needs to generate electricity using high-temperature waste heat generated from engines such as automobiles and ships and thermoelectric elements.

In this case, a fluid moving part through which a first fluid is passed may be disposed on a low-temperature part side of the thermoelectric element, a heat sink may be disposed on a high-temperature part side of the thermoelectric element, and a second fluid may be passed through the heat sink. Accordingly, electricity may be generated by a difference in temperature between the low temperature part and the high temperature part of the thermoelectric element.

DISCLOSURE

Technical Problem

Embodiments of the present invention are to provide a thermoelectric module that generates electricity using a difference in temperature between a low-temperature part and a high-temperature part of a thermoelectric element, and a power generator including the same.

In addition, embodiments of the present invention are to provide a thermoelectric module having improved moisture resistance even if the size is increased, and a power generator including the same.

Further, embodiments of the present invention are to provide thermoelectric modules disposed long side by side to improve power generation performance, and a power generator including the thermoelectric modules.

Problems to be solved in the embodiments are not limited to the above-described problems and objects and effects which may be determined from the solutions and the embodiments of the problems described below are also included.

Technical Solution

A thermoelectric device according to an embodiment of the present invention may include a fluid moving part; a thermoelectric module disposed on the fluid moving part; a guide part disposed on the fluid moving part and spaced apart from the thermoelectric module; and a shield member disposed on the thermoelectric module, wherein a portion of the guide part may be overlapped with the shield member in a vertical direction.

The guide part may include a groove part disposed in a region overlapped with the shield member in the vertical direction.

The guide part may include a central part, and a support part disposed to be spaced apart from the central part, and the groove part of the guide part may be disposed on an upper surface of the support part.

The shield member may have a plurality of shield members disposed to be spaced apart from each other in a first direction, the central part may be disposed between the plurality of shield members adjacent to each other, and the support part may be disposed below the plurality of shield members.

The fluid moving part may include a groove part extended in a first direction; the thermoelectric device may further include a first sealing member disposed on the groove part of the fluid moving part; and a second sealing member disposed between the guide part and the shield member.

The second sealing member may be disposed on the groove part of the guide part, the upper surface of the support part, and a side surface of the central part which is in contact with the upper surface of the support part.

The second sealing member may be extended to a side surface of the support part inclined between the upper surface of the support part and the groove part of the fluid moving part, the groove part of the guide part may be extended in a second direction perpendicular to the first direction, and the first direction may correspond to a direction in which a plurality of thermoelectric modules or a plurality of shield members are arranged.

The first sealing member may be in contact with the second sealing member, a length of the central part in the second direction may be greater than a length between the plurality of groove parts in the second direction, and the central part may be at least partially overlapped with the groove part of the fluid moving part in a vertical direction.

A length of the central part in the second direction may be greater than a length of the support part in the second direction.

The groove part of the guide part may be disposed on an inner side of the groove part of the fluid moving part.

The shield member may include a plurality of shield holes, the thermoelectric module may include a thermoelectric element in contact with one surface of the fluid moving part; and a heat sink disposed on the thermoelectric element, and the heat sink may pass through the plurality of shield holes.

The shield member may include a first part overlapped with the thermoelectric module in a vertical direction; a second part offset from the thermoelectric module in the vertical direction; and a stepped part connecting the first part and the second part, and the second part is closer to one surface of the fluid moving part than the first part.

The thermoelectric device may further include a third sealing member disposed between the thermoelectric module and the shield member; wherein the third sealing member may be spaced apart from the first sealing member.

The thermoelectric element may include a first substrate in contact with one surface of the fluid moving part; a second substrate disposed to be spaced apart from the first substrate; a first electrode disposed on the first substrate; a second electrode disposed below the second substrate; and a plurality of thermoelectric legs disposed between the first electrode and the second electrode; the third sealing member may be disposed between an edge of the second substrate and an edge of the shield hole and overlapped with the first substrate in the vertical direction.

An area of the shield hole may be smaller than an area of the second substrate.

Advantageous Effects

According to an embodiment of the present invention, it is possible to obtain a power generator that may be simply assembled and has excellent power generation performance.

In addition, according to embodiments of the present invention, it is possible to implement a thermoelectric module having improved moisture resistance even if the size is increased, and a power generator including the same.

In particular, it is possible to provide a thermoelectric module in which the thermoelectric module is protected from moisture, heat, or other contaminants by having the shield member and the sealing member, and a power generator including the thermoelectric module.

In addition, it is possible to provide a thermoelectric module having high power generation efficiency per unit area and a power generator including the same.

Various beneficial advantages and effects of the present invention are not limited by the detailed description and should be easily understood through a description of a detailed embodiment of the present invention.

BEST MODE

Figure 1:
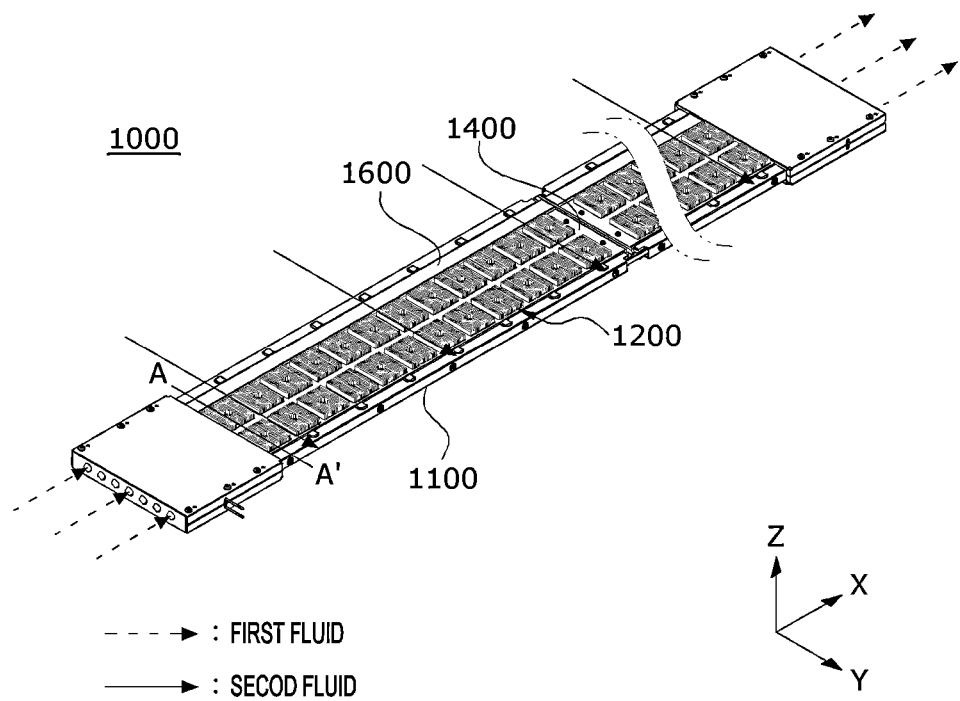
FIG. 1 is a perspective view of a power generator according to an embodiment of the present invention.

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively coupled and replaced to be used within the scope of the technical spirit of the present invention.

In addition, the terms used in the embodiments of the present invention (including technical and scientific terms) may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one combination among all combinations which may be combined with A, B, and C.

In addition, terms such as first, second, A, B, (a), (b), and the like may be used to describe elements of the embodiments of the present invention.

These terms are only provided to distinguish the elements from other elements, and the essence, sequence, order, or the like of the elements are not limited by the terms.

In addition, when an element is described as being "connected", "coupled", or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, when an element is described as being disposed "on or under" another element, such a description may include a case in which the element is disposed at an upper side or a lower side with respect to another element.

First of all, a thermoelectric device (or power generator) of the present invention may be used in a power generation system comprised of thermoelectric modules. For example, the power generator (including a thermoelectric module or a thermoelectric element as a thermoelectric device) may include a path or a tube through which fluid is moved. Further, the power generator may be applied in various ways depending on a difference in temperature between a low-temperature part and a high-temperature part of the thermoelectric element.

Figure 2:
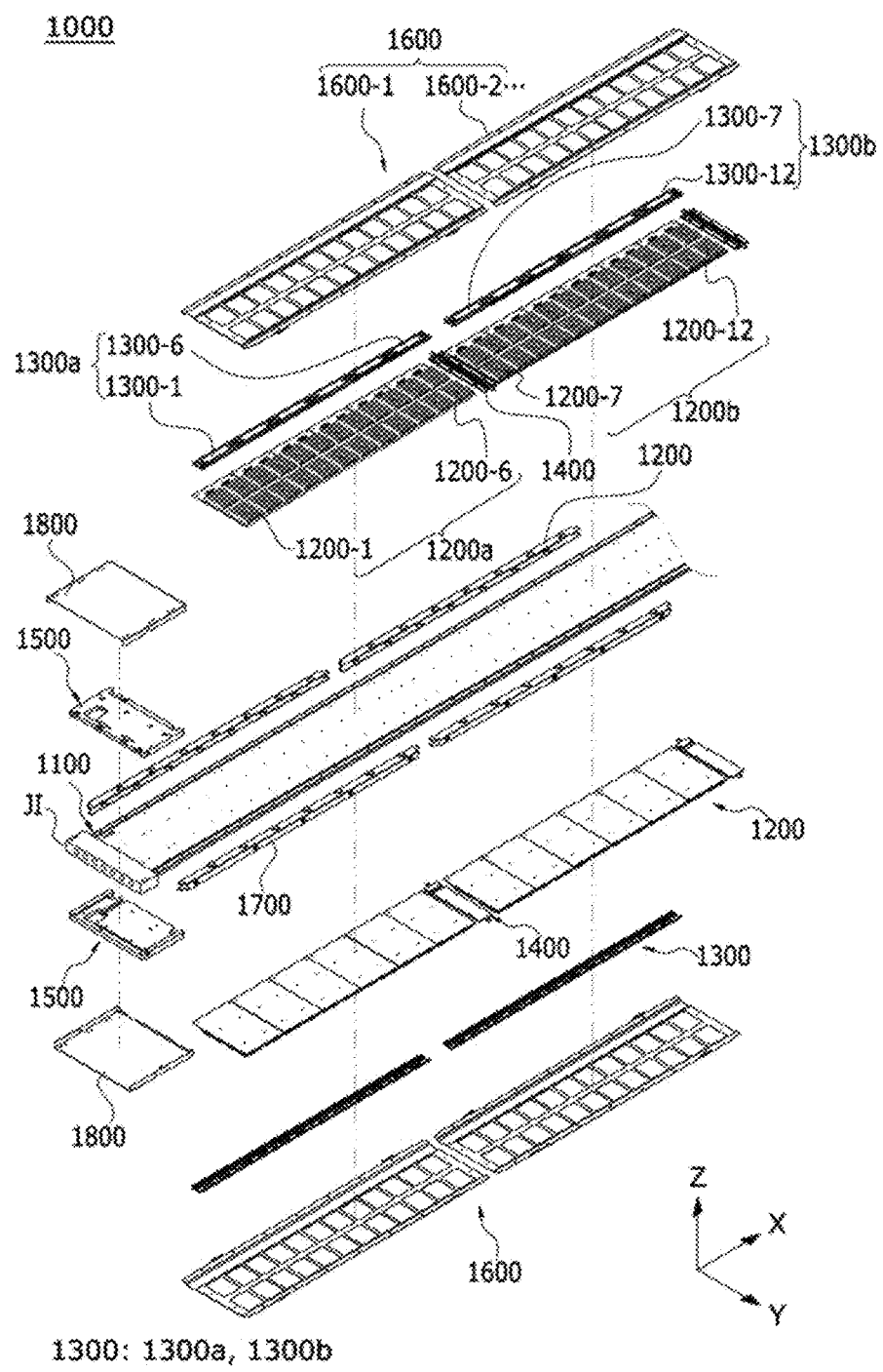
FIG. 2 is an exploded perspective view of a power generator according to an embodiment of the present invention.

FIG. 1 is a perspective view of a power generator according to an embodiment of the present invention, and FIG. 2 is an exploded perspective view of a power generator according to an embodiment of the present invention.

Referring to FIGS. 1 and 2, a thermoelectric device 1000 (or 'power generator') includes a fluid moving part 1100, a thermoelectric module 1200, a cover member 1300, a guide part 1400, and dummy modules 1500, a shield member 1600, a fixing member 1700, and a case 1800. Furthermore, the thermoelectric device 1000 according to the embodiment may further include wires electrically connected to the thermoelectric module 1200, and may further include various elements such as screws, which are fastening members for coupling between components as described later. In addition, in accordance with the embodiment, there may be a plurality of thermoelectric devices, which are disposed to be spaced apart from each other at predetermined intervals side by side (e.g., in parallel) to form the power generation system.

In addition, in the thermoelectric device 1000 according to the embodiment, it is possible to generate power through the thermoelectric module 1200 using a difference in temperature between a first fluid flowing through the inside of the fluid moving part 1100 and a second fluid passing through the outside of the fluid moving part 1100.

Specifically, the first fluid introduced into the fluid moving part 1100 may be water, but is not limited thereto, and may be various types of fluids (for example, gas, etc.) having cooling performance. In addition, a temperature of the first fluid flowing into the fluid moving part 1100 may be less than 100° C., preferably less than 50° C., more preferably less than 40° C., but is not limited thereto, and may be lower than a temperature of the second fluid. The temperature of the first fluid discharged after passing through the fluid moving part 1100 may be higher than the temperature of the first fluid introduced into the fluid moving part 1100.

The first fluid may be introduced from a fluid inlet disposed on one side of the fluid moving part 1100 and discharged through a fluid outlet disposed on the other side opposite to one side. In order to facilitate the inflow and outflow of the first fluid and to support the fluid moving part 1100, an inlet flange JI and an outlet flange (not shown) may be further disposed on the fluid inlet side and the fluid outlet side of the fluid moving part 1100, respectively.

Meanwhile, the second fluid may pass through the outside of the fluid moving part 1100, for example, a heat sink of the thermoelectric module 1200 disposed outside the fluid moving part 1100. The second fluid may be waste heat generated from engines such as automobiles, ships, and the like, but is not limited thereto. For example, the temperature of the second fluid may be 100° C. or more, preferably 200° C. or more, more preferably 220° C. to 250° C., but is not limited thereto, and may be higher than the temperature of the first fluid.

In the present specification, an example in which the temperature of the first fluid flowing through the inside of the fluid moving part 1100 is higher than the temperature of the second fluid passing through a heat sink 1220 of the thermoelectric module 1200 disposed outside the fluid moving part 1100 will be described. Accordingly, in this specification, the fluid moving part 1100 may be referred to as a duct or a cooling part. However, the embodiment of the present invention is not limited thereto, and the temperature of the first fluid flowing through the inside of the fluid moving part 1100 may be higher than the temperature of the second fluid passing through the heat sink 1220 of the thermoelectric module 1200 disposed outside the fluid moving part 1100.

In addition, in the present specification, the first fluid may be moved in a first direction (X-axis direction), and the flow path of the fluid moving part 1100 may be also extended in the first direction. Further, a second direction (Y-axis direction) may correspond to the moving direction of the second fluid in a direction perpendicular to the first direction (X-axis direction). Further, a third direction (Z-axis direction) may be a vertical direction perpendicular to both the first direction (X-axis direction) and the second direction (Y-axis direction). The third direction (Z-axis direction) may be used interchangeably with the vertical direction, and may correspond to a direction from a lower thermoelectric module to an upper thermoelectric module with respect to the fluid moving part 1100.

The thermoelectric module 1200 may be disposed on the fluid moving part 1100. Further, there may be a plurality of thermoelectric modules 1200, each of which may be disposed on one surface of the fluid moving part 1100, that is, an upper surface and a lower surface of the fluid moving part 1100. Here, the upper surface means an outer surface disposed in a third direction or a vertical direction, and the lower surface means an outer surface disposed in a direction opposite to the third direction. Furthermore, the thermoelectric modules 1200 may be positioned to correspond to each other with respect to the fluid moving part 1100. For example, the thermoelectric module 1200 below the fluid moving part 1100 may be overlapped with the thermoelectric module 1200 above the fluid moving part 1100 in a third direction (Z-axis direction). Hereinafter, unless specifically explained otherwise, the thermoelectric module 1200, the cover member 1300, the guide part 1400, the dummy modules 1500, the shield member 1600, and the case 1800 will be described with respect to the upper surface of the fluid moving part 1100.

In addition, the thermoelectric module 1200 according to an embodiment of the present invention may include a thermoelectric element and a heat sink disposed on the thermoelectric element. Accordingly, the thermoelectric module 1200 may generate electricity by the Seebeck effect generated by a difference in temperature between the first fluid and the second fluid, as described above. The thermoelectric element of the thermoelectric module 1200 may have the structure of the thermoelectric element illustrated in FIGS. 6 and 7. A detailed description will be given later.

The thermoelectric module 1200 may be disposed on the upper surface and the lower surface of the fluid moving part 1100, and there may be a plurality of thermoelectric modules. For example, the thermoelectric modules 1200 may include a first thermoelectric module 1200-1 to a twelfth thermoelectric module 1200-12, as shown in FIG. 2. Accordingly, way, although the number of thermoelectric modules 1200 is illustrated as 12, this is an example and is not limited to this number.

In addition, six thermoelectric modules (for example, 1200-1 to 1200-6) corresponding to the guide part 1400 or the shield member 1600 may form one first thermoelectric module group 1200a, and six thermoelectric modules (for example, 1200-7 to 1200-12) disposed to be spaced apart from each other in the first direction (X-axis direction) may form another second thermoelectric module group 1200b. Hereinafter, it will be described on the basis of the fact that six thermoelectric modules are shielded by one shield member (for example, 1600-1). However, the number of thermoelectric modules 1200 may be variously changed depending on the size of the shield member 1600, the size of the fluid moving part 1100, and the like, as described above.

In addition, in the present specification, the first direction (X-axis direction) may correspond to an arrangement direction of the plurality of thermoelectric modules 1200. That is, the plurality of thermoelectric modules 1200 may be disposed side by side to be overlapped with each other in the first direction (X-axis direction).

As will be described later, the thermoelectric element of the thermoelectric module 1200 includes a first substrate disposed so as to be in contact with the fluid moving part 1100, a plurality of first electrodes disposed on the first substrate, a plurality of thermoelectric legs disposed on the plurality of first electrodes, a plurality of second electrodes disposed on the plurality of thermoelectric legs, and a second substrate disposed on the plurality of second electrodes, and a heat sink is disposed on the second substrate. And, between the first substrate and the plurality of first electrodes and between the plurality of second electrodes and the second substrate, respectively, an insulating layer may be further disposed.

Further, the first substrate of the thermoelectric element disposed on the fluid moving part 1100 may be a metal substrate, and the metal substrate may be adhered to the surface of the fluid moving part 1100 by a thermal interface material (TIM) (not shown). Since the metal substrate has excellent heat transfer performance, heat transfer between the thermoelectric element and the fluid moving part 1100 is easy. In addition, when the metal substrate and the fluid moving part 1100 are adhered by a thermal interface material (TIM), heat transfer between the metal substrate and the fluid moving part 1100 may not be hindered. Here, the metal substrate may be one of a copper substrate, an aluminum substrate, and a copper-aluminum substrate, but is not limited thereto. A detailed description of the thermoelectric element will be described later.

Each of the plurality of thermoelectric modules 1200 may include a connector for extracting generated electricity to the outside or providing electricity generated from the Seebeck effect.

In this case, the cover member 1300 may be disposed on the connector of the thermoelectric module 1200. Accordingly, the cover member 1300 may protect the connector of the thermoelectric module 1200.

In addition, the cover member 1300 is coupled to the thermoelectric module 1200 and the fluid moving part 1100 by screws, threads, bonding members, or the like, so that coupling force between the fluid moving part 1100 and the thermoelectric module 1200 may be improved. Furthermore, the cover member 1300 is coupled to the fluid moving part 1100 and the shield member 1600 through a bonding members, a screw, and the like), so that the coupling force between the shield member 1600, the cover member 1300, the thermoelectric module 1200, and the fluid moving part 1100 may also be improved.

The cover member 1300 may be disposed on the first substrate of the thermoelectric element in the thermoelectric module 1200. For example, the cover member 1300 may be disposed on a region where the first substrate of the thermoelectric element is not overlapped with the second substrate (hereinafter, corresponding to a second region). Further, the connector of the thermoelectric module and the cover member 1300 may be disposed on the region where the first substrate is not overlapped with the second substrate.

In addition, there may be a plurality of over members 1300 corresponding to the thermoelectric modules 1200. For example, the number of cover members 1300 in the thermoelectric device 1000 may be the same as the number of thermoelectric modules. For example, the plurality of cover members may include a first cover member 1300-1 to a twelfth cover member 1300-12 and may overlap with each other in the first direction (X-axis direction). For example, the cover members 1300 may include a first cover member group 1300a and a second cover member group 1300b. Further, the first cover member group 1300a may include the first cover member 1300-1 to the sixth cover member 1300-6, and the second cover member group 1300b includes the seventh cover member 1300-7 to the twelfth cover member 1300-12. In addition, the plurality of cover members 1300 may be symmetrically disposed with respect to the fluid moving part 1100, similar to the thermoelectric module. That is, the cover member 1300 may be disposed on the upper surface or lower surface of the fluid moving part 1100.

The guide part 1400 may be disposed between the first thermoelectric module group 1200a and the second thermoelectric module group 1200b. That is, the guide part 1400 may be disposed between the thermoelectric modules adjacent to each other or the thermoelectric module groups adjacent to each other.

Furthermore, the guide part 1400 according to the embodiment may be disposed between the cover members 1300 adjacent to each other or between the cover member groups adjacent to each other. In addition, the guide part 1400 may be disposed between the shield members 1600 adjacent to each other.

Specifically, at least a portion of the guide part 1400 may be positioned between the shield members 1600 adjacent to each other and another portion of the guide part 1400 may be positioned below the shield member 1600. Accordingly, the portion of the guide part 1400 may overlap with the shield member 1600 in the vertical direction. Thus, the guide part supports the shield member 1600 and compensates for a spaced distance between the fluid moving part 1100 and the shield member 1600, thereby effectively providing a sealing effect even if a height of the second sealing member is small in the vertical direction. Furthermore, a structure such as a gap generated as the height of the second sealing member is increased in the vertical direction may be suppressed. Accordingly, the guide part 1400 is disposed at boundaries between the shield members 1600-1 and 1600-2 adjacent to each other, and sealing of the plurality of thermoelectric modules 1200 or thermoelectric module groups may be performed for each of the shield members. For example, the guide part 1400 may seal a space between the shield member 1600 and the fluid moving part 1100 to prevent moisture or contaminants between the first shield member 1600-1 and the second shield member 1600-2 spaced apart from each other from penetrating into the thermoelectric modules below each of shield members. Furthermore, the guide part 1400 facilitates applying of the second sealing member to be described later, thereby improving reliability of the thermoelectric device 1000 through sealing by the second sealing member.

The dummy module 1500 may be disposed on the upper surface and the lower surface of the fluid moving part 1100. In addition, the dummy module 1500 may be disposed on end sides of the fluid moving part 1100 in the first direction (X-axis direction). For example, two dummy modules 1500 may be disposed to be spaced apart from each other in the first direction (X-axis direction) on the upper surface of the fluid moving part 1100, and the plurality of thermoelectric modules 1200 may be disposed between the two dummy modules 1500.

The dummy modules 1500 may include a groove or a hole through which an electric wire connected to a connector may be guided to the outside or the like.

In addition, the dummy module 1500 may be at least partially overlapped with the shield member 1600 in a third direction (Z-axis direction). For example, the second sealing member may be applied to the overlapped region, so that the dummy module 1500 may be coupled to the shield member 1600 through the second sealing member. In the present specification, the second sealing member includes a second-first sealing member and a second-second sealing member, the second-first sealing member is a sealing member guided by the above-described guide part, and the second-second sealing member means a sealing member that is at least partially overlapped with the dummy module 1500 in the vertical direction. However, the second sealing member will be described in this specification, and a detailed description thereof will be described later.

Thus, the first sealing member and the second sealing member may be disposed along an edge of the shield member 1600. In an embodiment, the first sealing member may be at least partially connected to the second sealing member. For example, the first sealing member and the second sealing member may be in contact with each other at the edge of the shield member 1600 to form a closed loop. Accordingly, as a length of the shield member 1600 is increased in the first direction, there may be a limit on the process, a bending may increase due to heat or pressure, and a heat imbalance may occurs. Thus, a plurality of shield members 1600 may be disposed side by side along the first direction. Accordingly, since a separation space inevitably occurs between the shield members 1600 adjacent to each other in the first direction in the process, the first sealing member and the second sealing member are in contact with the edge of the shield member 1600, so that the thermoelectric module within one shield member 1600 may be protected. For example, the thermoelectric module 1200 below the shield member 1600 may be easily protected from moisture or contaminants.

The shield member 1600 may be disposed above or below the fluid moving part 1100. The shield member 1600 may be symmetrically disposed with respect to the fluid moving part 1100 as described above.

In addition, there may be a plurality of shield members 1600 which may be disposed to be spaced apart from each other in the first direction (X-axis direction) on the upper surface of the fluid moving part 1100. A separation space exists between the shield members 1600 adjacent to each other, for example, the first shield member 1600-1 and the second shield member 1600-2, and a portion of the guide part 1400 may be disposed in the separation space.

In addition, the shield member 1600 may cover at least one thermoelectric module 1200 or thermoelectric module groups. In this case, the shield member 1600 may include a shield hole corresponding to the heat sink of the thermoelectric module 1200. That is, the heat sink may pass through the shield hole of the shield member 1600.

The shield member 1600 is coupled to the fluid moving part 1100, the guide part 1400, and the dummy module 1500, and the lower portion of the shield member 1600, that is, the thermoelectric module, may be protected by the first sealing member and the second sealing member. In addition, the shield member 1600 is coupled to the second substrate of the thermoelectric element by a third sealing member, and the third sealing member may block contaminants or the like penetrating between the second substrate and the shield member 1600. A detailed description of this will be explained later.

The fixing member 1700 may be disposed on a surface facing the fluid moving part 1100 in the second direction (Y-axis direction). There may be a plurality of fixing members 1700. The number of fixing members 1700 may be the same as the number of shield members 1600.

In addition, the fixing member 1700 includes a recess, and the fluid moving part 1100 and the shield member 1600 may be positioned in the recess. That is, the fixing member 1700 may improve the coupling force between the fluid moving part 1100 and the shield member 1600. Furthermore, the fixing member 1700 may primarily block penetration of external contaminants into the shield member 16000 and the fluid moving part 1100. Additionally, bearings or sealing members may be further disposed in the recess. This fixing member 1700 may have a '⌴' shape, as an example.

The case 1800 may be disposed on an upper portion of the dummy module 1500 above the fluid moving part 1100 or a lower portion of the dummy module 1500 below the fluid moving part 1100 to surround the dummy modules 1500. The case 1800 may surround the dummy modules 1500 at its upper and lower portions. Further, at least a portion of the case 1800 may be overlapped with the shield member 1600 in the third direction (Z-axis direction). Accordingly, the case 1800 may protect the dummy module 1500 and the shield member 1600.

Hereinafter, each of components described above will be described in detail.

Figure 3:
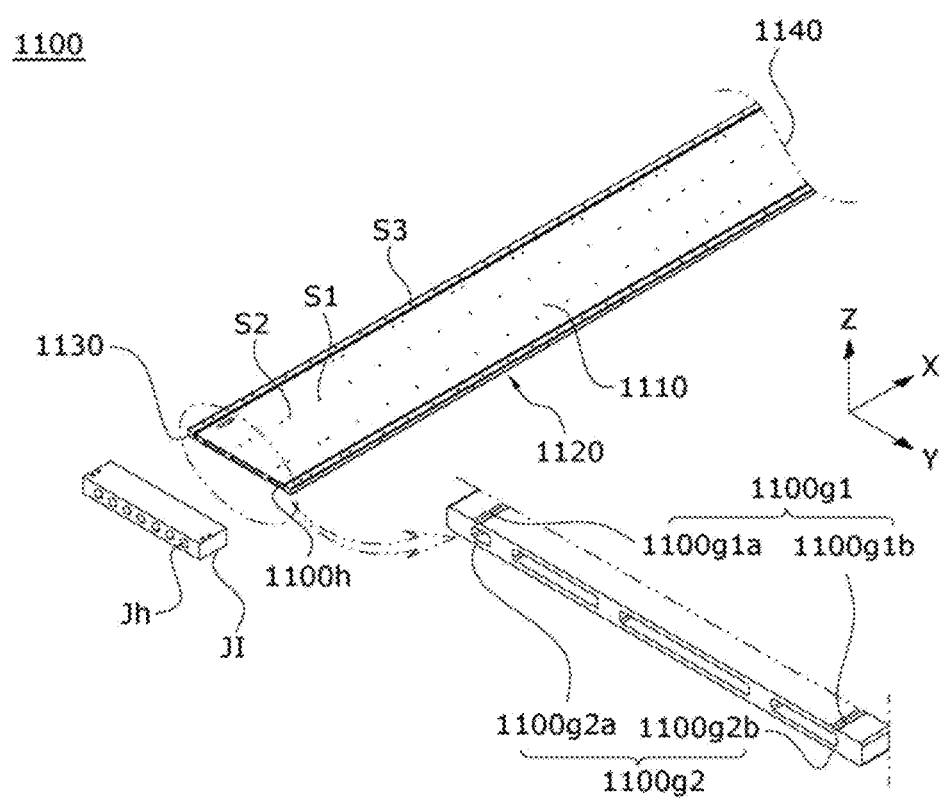
FIG. 3 is a perspective view of a fluid moving part of a power generator according to an embodiment of the present invention.
Figure 4:
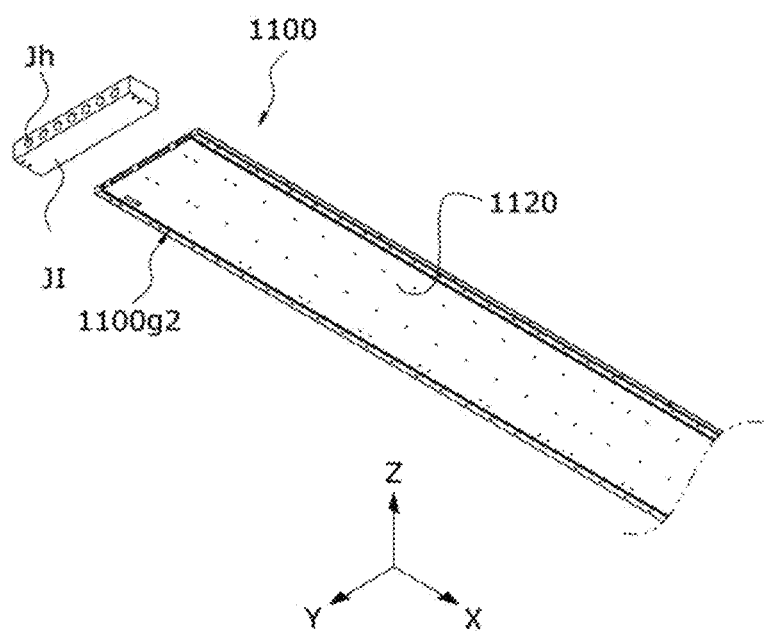
FIG. 4 is another perspective view of a fluid moving part of a power generator according to an embodiment of the present invention.
Figure 5:
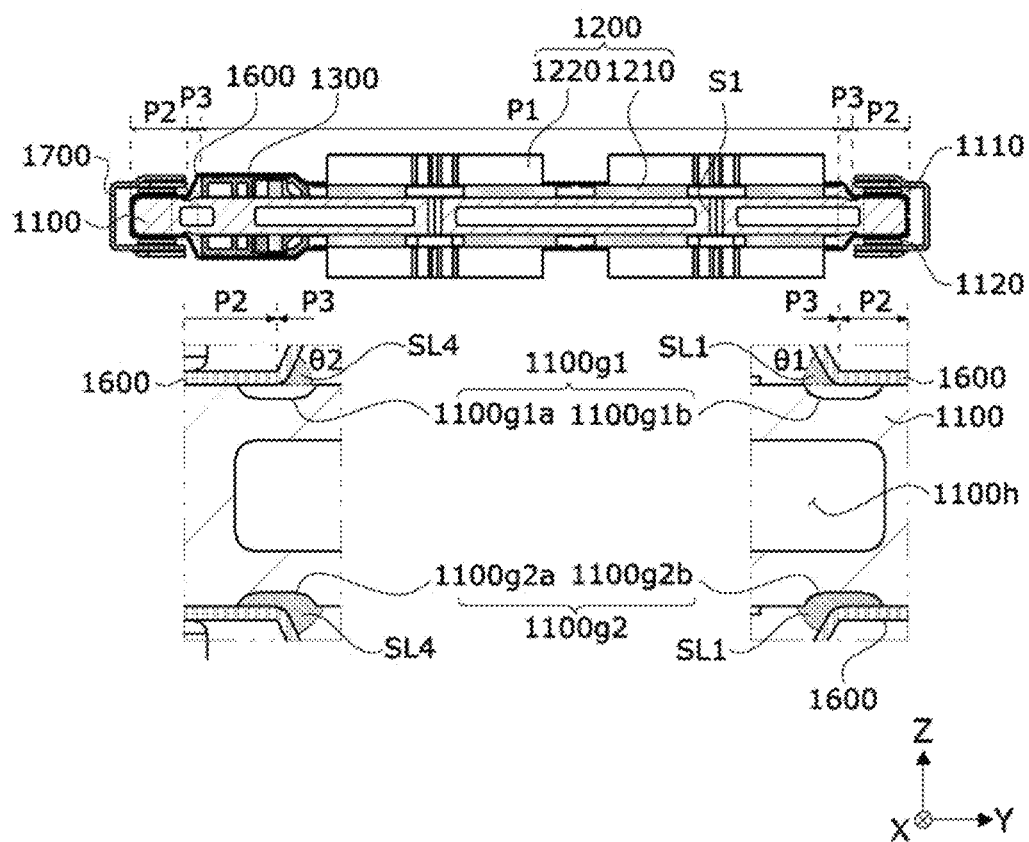
FIG. 5 is a cross-section view taken along a line A-A" in FIG. 1.

FIG. 3 is a perspective view of a fluid moving part of a power generator according to an embodiment of the present invention; FIG. 4 is another perspective view of a fluid moving part of a power generator according to an embodiment of the present invention, and FIG. 5 is a cross-section view taken along a line A-A" in FIG. 1.

Referring to FIGS. 3 to 4, the fluid moving part 1100 according to the embodiment may include an upper surface 1110 and a lower surface 1120 that are opposite to each other in the vertical direction or the third direction (Z-axis direction).

According to an embodiment of the present invention, a plurality of thermoelectric modules 1200, a plurality of cover members, a plurality of guide parts, a plurality of dummy modules, a shield member, and the like may be disposed on one surface of the fluid moving part 1100. For example, a first substrate that is a lower substrate of the thermoelectric module 1200 may be disposed on one surface (for example, an upper surface or a lower surface) of the fluid moving part 1100. The first substrate may be disposed to be in indirectly contact with one surface of the fluid moving part 1100 through a thermal interface material (TIM) or the like.

In addition, the fluid moving part 1100 may include an inlet surface 1130 and an outlet surface 1140 that face each other in the first direction (X-axis direction). The fluid moving part 1100 may include a fluid hole 1100h extended in the first direction (X-axis direction). A first fluid may be introduced into the inlet surface 1130 disposed on one side of the fluid hole 1100h and discharged to the outlet surface 1140 disposed on another side of the fluid hole 1100h. The positions of the inlet surface 1130 and the outlet surface 1140 may be interchanged.

Further, an inlet flange JI may be disposed on the inlet surface 1130 as described above. In addition, an outlet flange (not shown) may be disposed on the outlet surface 1140. The inlet flange JI and the outlet flange may include holes Jh. The holes Jh of the inlet flange JI and the outlet flange may be extended in the first direction (X-axis direction). Further, the inlet flange JI may be positioned to correspond to the fluid hole 1100h of the fluid moving part 1100. For example, the holes Jh of the inlet flange JI and the outlet flange may be overlapped with the fluid hole 1100h of the fluid moving part 1100 in the first direction (X-axis direction). Accordingly, when the first fluid is introduced through the holes Jh of the inlet flange JI, the first fluid may be passed through the holes Jh of the inlet flange JI and moved to the fluid hole 1100h. Further, the first fluid passing through the fluid hole 110h may be discharged through the holes of the outlet flange. The area of the hole Jh of the inlet flange JI and the outlet flange may be different from the area of the fluid holes 1100h (e.g., the cross-sectional area perpendicular to the first direction (YZ plane)). For example, the area of the hole Jh of the inlet flange JI and the outlet flange may be smaller than the area of the fluid hole 1100h. In addition, the number of holes Jh of the inlet flange JI and the outlet flange may be different from the number of fluid holes 1100h. However, this is exemplary, and the number, position, shape, and the like of the holes in the fluid inlet and fluid outlet are not limited thereto. The fluid moving part 1100 may be formed with one fluid inlet, one fluid outlet, and a fluid passage pipe connecting them.

In addition, the fluid moving part 1100 may include a plurality of first fastening holes S1 and S2 extended in the vertical direction. The fluid moving part 1100 may be coupled to the thermoelectric module and the dummy module through the plurality of first fastening holes S1 and S2. Accordingly, the thermoelectric module disposed on the upper surface 1110 of the fluid moving part 1100 and the thermoelectric module disposed below the lower surface 1120 of the fluid moving part 1100 may face each other. Thus, power generation and power generation control may be easily performed by the temperature difference.

Furthermore, the plurality of first fastening holes S1 and S2 may not be overlapped with the fluid hole 1100h in the vertical direction. Accordingly, the damage to the screws or the like disposed in the first fastening holes S1 and S2 may be easily prevented by the first fluid, and the coupling force between the fluid moving part 1100 and the thermoelectric module or the dummy module may be improved.

In addition, the fluid moving part 1100 according to the embodiment may include a plurality of groove parts 1100g disposed to be spaced apart from each other on the upper surface 1110 or the lower surface 1120 in the second direction (Y-axis direction). For example, a groove part 1100g1 (e.g., an upper groove part) disposed to be spaced apart in the second direction (Y-axis direction) may be disposed on the upper surface 1110 of the fluid moving part 1100. In addition, a groove part 1100g2 (for example, a lower groove part) disposed to be spaced apart in the second direction (Y-axis direction) may be disposed on the lower surface 1120 of the fluid moving part 1100.

There may be a plurality of groove parts 1100g1 on the upper portion of the fluid moving part 1100. For example, the groove parts 1100g1 may include a first-first groove 1100g1a and a first-second groove 1100g1b disposed to be spaced apart from each other in the second direction (Y-axis direction). A minimum separation distance between the first-first groove 1100g1a and the thermoelectric module (for example, heat sink) in the second direction (Y-axis direction) may be different from a minimum separation distance between the first-second groove 1100g1b and the thermoelectric module (for example, heat sink) in the second direction (Y-axis direction). For example, the minimum separation distance between the first-first groove 1100g1a and the thermoelectric module (for example, heat sink) in the second direction (Y-axis direction) may be smaller than the minimum separation distance between the first-second groove 1100g1b and the thermoelectric module (for example, heat sink) in the second direction (Y-axis direction). Accordingly, it is possible to easily secure a space for disposing first and second connectors and electric wires, which will be described later.

In addition, there may be a plurality of groove parts 1100g2 on the lower portion of the fluid moving part 1100. For example, the groove parts 1100g2 may include a second-first groove 1100g2a and a second-second groove 1100g2b disposed to be spaced apart from each other in the second direction (Y-axis direction).

Further, the first fastening holes S1 and S2 may be disposed between the groove parts 1100g of the fluid moving part 1100 according to the embodiment. In other words, the thermoelectric module and the dummy module may be disposed between the groove parts 1100g of the fluid moving part 1100 according to the embodiment. In positions, the groove parts 1100g of the fluid moving part 1100 may be disposed outside the thermoelectric module 1200. Accordingly, as will be described later, the first sealing member is applied to the groove parts 1100g of the fluid moving part 1100 and bonded to the shield member, thereby easily protecting the thermoelectric module from permeation of contaminants introduced from the outside. In this specification, the description of "inside" may refer to a direction from the outside of the fluid moving part 1100 toward the center, and the description of "outside" may refer to a direction from the center of the fluid moving part 1100 toward the outside. The center of the fluid moving part 1100 may be a center of gravity or an intersection of lines bisecting each corner.

In addition, the fluid moving part 1100 may further include a plurality of second fastening holes S3 extended in the vertical direction. The fluid moving part 1100 may be coupled to the shield member and the fixing member through the second fastening hole S3 by screwing or the like.

Referring to FIG. 5, the shield member 1600 according to the embodiment may include a first part P1 overlapped with the thermoelectric module 1200 in the vertical direction and a second part P2 that is offset from the thermoelectric module 1200 in the vertical direction, and a stepped part P3 connecting the first part P1 and the second part P2 between the first part P1 and the second part P2.

A shield hole is disposed in the first part P1, and the heat sink 1220 may be passed through the shield hole. A description of this will be explained later.

Further, the thermoelectric element 1210 and the cover member 1300 may be positioned below the first part P1. The first part P1 may have an additional stepped region on the cover member 1300.

The second part P2 may be offset from the thermoelectric module 1200 in the vertical direction, and may be in contact with one surface (for example, upper surface) of the fluid moving part 1100. That is, the second part P2 may be disposed closer to one surface (for example, upper surface) of the fluid moving part 1100 than the first part P1. For example, a vertical distance between the first part P1 and the upper surface of the fluid moving part 1100 may be greater than a vertical distance between the second part P2 and the upper surface of the fluid moving part 1100. In an embodiment, since the height of the fluid moving part 1100 in the vertical direction is smaller than the height of the thermoelectric module 1200 in the vertical direction, the thermoelectric module 1200 may be disposed inside the fluid moving part 1100 or in the groove. Accordingly, the height of the first part P1 from one surface (for example, the upper surface) of the fluid moving part 1100 is smaller than the height of the second part P2 from the one surface (for example, upper surface) of the fluid moving part 1100, so that a space for the thermoelectric module may be easily secured.

The stepped part P3 may be disposed between the first part P1 and the second part P2. The stepped part P3 may be in contact with the first part P1 and the second part P2. In addition, the stepped part P3 may be inclined at predetermined angles θ1 and θ2 with respect to the second part P2. Further, the predetermined angles θ1 and θ2 may be different from each other. For example, the angle θ2 (for example, second angle) between the second part P2 that is more adjacent to the cover member 1300 and the stepped part P3 may be different from the angle θ1 (for example, first angle) between the second part P2 spaced apart from the cover member 1300 and the stepped part P3. The first angle θ1 may be smaller than the second angle θ2. Accordingly, a space in which the cover member 1300 may be disposed below the first part P1 may be easily secured. With this configuration, resistance to fluid of the shield member 1300 may be increased. Accordingly, the movement of the fluid on the shield member 1300 is reduced, so that heat exchange between the fluid and the heat sink of the thermoelectric module passing through the shield member 1300 may be increased. As a result, energy efficiency of the thermoelectric device according to the embodiment may be improved.

In addition, the second part P2 may be positioned outside the thermoelectric module 1200 or the first part P1. For example, the second part P2, the stepped part P3, the first part P1, the stepped part P3, and the second part P2 may be sequentially disposed from the shield member 1600 in the second direction.

Further, the groove part 1100g according to the embodiment may be overlapped with at least a portion of the shield member 1600 in the vertical direction (Z-axis direction). For example, the upper groove part 1100g1 and the lower groove part 1100g2 may be overlapped with at least one of the second part P2 and the stepped part P3 in the vertical direction (Z-axis direction). As an embodiment, the groove part 1100g of the fluid moving part 1100 may be positioned below a boundary surface between the second part P2 and the stepped part P3. The boundary surface may be disposed outside the thermoelectric module 1200. Accordingly, when the first sealing member SL1 is applied to the groove part 1100g, the first sealing member SL1 is in contact with both the second part P2 and the stepped part P3, so that an empty space between the second part P2 and the fluid moving part 1100 may be easily removed. For example, the first sealing member LS1 is in contact with both the second part P2 and the stepped part P3, and the second part P2 presses the first sealing member SL1 from the outside, so that the inside of the first sealing member SL1 may be convex toward the upper portion. Accordingly, the first sealing member SL1 may be in entirely contact with a bottom surface of the stepped part P3 and may be easily extended to the upper portion along the bottom surface. As a result, the coupling force between the shield member 1600 and the fluid moving part 1100 may be improved by the first sealing member SL1. In addition, contaminants, moisture and the like that may penetrate between the shield member 1600 and the fluid moving part 1100, particularly between the second part P2 and the fluid moving part 1100, may be blocked by the first sealing member SL1. Furthermore, overflowing of the first sealing member SL1 into the thermoelectric module may be suppressed.

Figure 6:
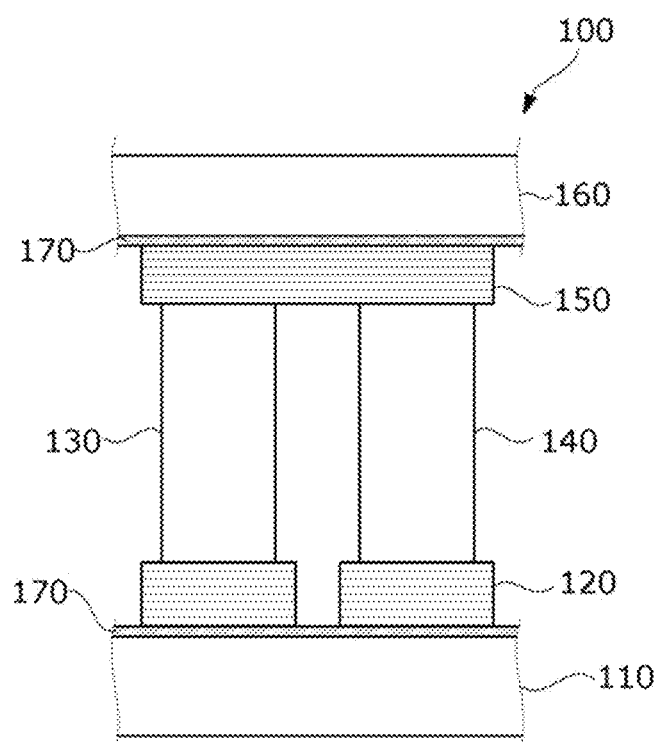
FIGS. 6 and 7 are views illustrating a thermoelectric element according to an embodiment of the present invention.
Figure 7:
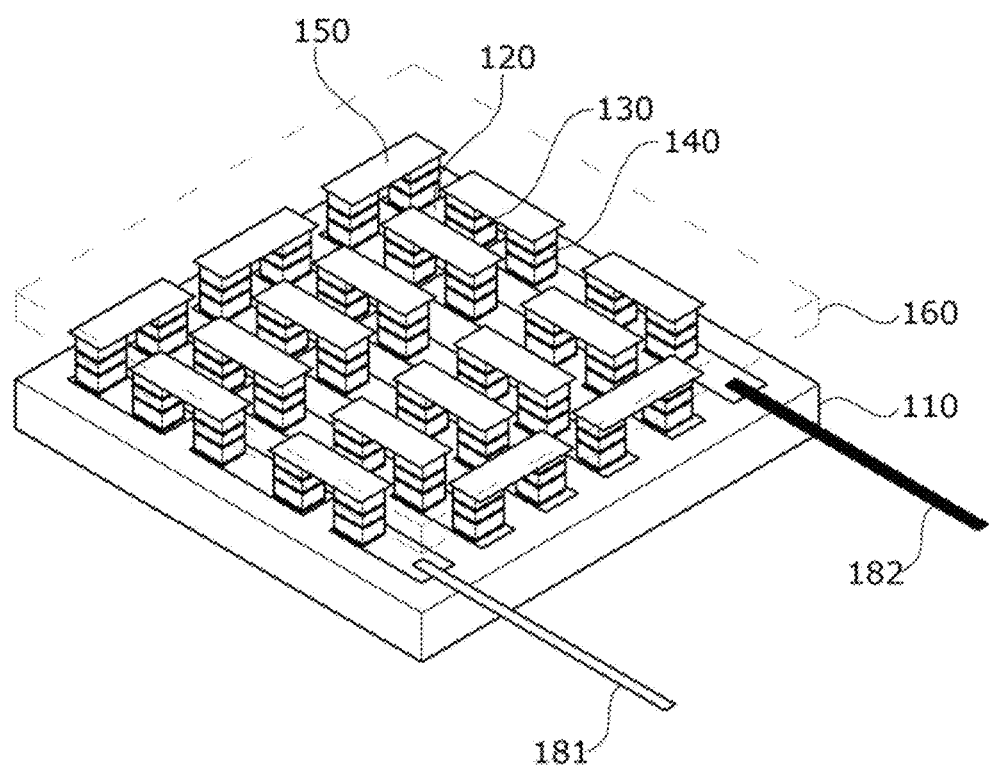

FIGS. 6 and 7 are views illustrating a thermoelectric element according to an embodiment of the present invention.

Referring to FIGS. 6 and 7, the thermoelectric element 100 includes a first substrate 110, a first electrode 120, a P-type thermoelectric legs 130, an N-type thermoelectric leg 140, and a second electrode 150, and a second substrate 160.

The first electrode 120 is disposed between the first substrate 110 and lower bottom surfaces of the P-type thermoelectric legs 130 and the N-type thermoelectric legs 140, and the second electrode 150 is disposed between the second substrate 160 and upper bottom surfaces of the P-type thermoelectric legs 130 and the N-type thermoelectric legs 140. Accordingly, a plurality of P-type thermoelectric legs 130 and a plurality of N-type thermoelectric legs 140 are electrically connected by the first electrodes 120 and the second electrodes 150. A pair of the P-type thermoelectric leg 130 and the N-type thermoelectric leg 140, which are disposed between the first electrodes 120 and the second electrodes 150 and electrically connected to each other, may form a unit cell.

For example, when a voltage is applied to the first electrode 120 and the second electrode 150 through lead wires 181 and 182, due to the Peltier effect, the substrate through which a current flows from the P-type thermoelectric leg 130 to the N-type thermoelectric leg 140 may absorb heat and thus serve as a cooling part, and the substrate through which a current flows from the N-type thermoelectric leg 140 to the P-type thermoelectric leg 130 may be heated and thus serve as a heating part. Alternatively, when a temperature difference is applied between the first electrode 120 and the second electrode 150, the charges in the P-type thermoelectric leg 130 and the N-type thermoelectric leg 140 are moved due to the Seebeck effect, so that electricity may be produced.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in a range of 99 to 99.999 wt % and a material containing at least one among nickel (Ni), aluminum (Al), copper (Cu), silver (Ag), lead (Pb), boron (B), gallium (Ga), and indium (In) in a range of 0.001 to 1 wt % based on a total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include a Bi—Se—Te-based main raw material in a range of 99 to 99.999 wt % and a material containing at least one among nickel (Ni), aluminum (Al), copper (Cu), silver (Ag), lead (Pb), boron (B), gallium (Ga), and indium (In) in a range of 0.001 to 1 wt % based on a total weight of 100 wt %.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of applying a sheet-shaped base with a paste including the thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal column shape, an elliptical column shape, or the like.

In this specification, the thermoelectric leg may also be referred to as a thermoelectric structure, a semiconductor device, a semiconductor structure, and the like.

Performance of the thermoelectric element according to one embodiment of the present invention may be represented by a figure of merit ZT. The figure of merit ZT may be expressed by Equation 1.

$$ZT = \alpha^2 \cdot \sigma \cdot T/k \qquad \text{[Equation 1]}$$

where $\alpha$ is the Seebeck coefficient [V/K], $\sigma$ is electrical conductivity [S/m], and $\alpha^2\sigma$ is a power factor [W/mK$^2$]. In addition, T is temperature and k is a thermal conductivity [W/mK]. k may be expressed as $a \cdot cp \cdot \rho$, wherein a is thermal diffusivity [cm2/S], cp is specific heat [J/gK], and $\rho$ is density [g/cm3].

In order to obtain a figure of merit of a thermoelectric element, a Z value [V/K] is measured using a Z meter, and the figure of merit ZT may be calculated using the measured Z value.

Here, the first electrode 120 disposed between the first substrate 110 and the P-type thermoelectric leg 130 and the N-type thermoelectric leg 140, and the second electrode 150 disposed between the second substrate 160 and the P-type thermoelectric leg 130 and the N-type thermoelectric leg 140 may include at least one among copper (Cu), silver (Ag), aluminum (Al), and nickel (Ni) and have a thickness of 0.01 mm to 0.3 mm. When the thickness of the first electrode 120 or the second electrode 150 is less than 0.01 mm, the function thereof as an electrode decrease and thus electrical conduction performance may be degraded, and, when the thickness thereof exceeds 0.3 mm, conduction efficiency may be degraded due to an increase in resistance.

In addition, the first substrate 110 and the second substrate 160 facing each other may be metal substrates and may have a thickness of 0.1 mm to 1.5 mm. When the thickness of the metal substrate is less than 0.1 mm or exceeds 1.5 mm, a heat dissipation characteristic or thermal conductivity may be excessively increased, so that the reliability of the thermoelectric element may be deteriorated. In addition, when the first substrate 110 and the second substrate 160 are metal substrates, an insulating layer 170 may be further formed between the first substrate 110 and the first electrodes 120 and between the second substrate 160 and the second electrodes 150. The insulating layer 170 may include a material having a thermal conductivity of 1 to 20 W/mK. In this case, the insulating layer 170 may be a resin composition containing at least one of an epoxy resin and a silicone resin and an inorganic material, a layer made of a silicon composite containing silicon and an inorganic material, or an aluminum oxide layer. Here, the inorganic material may be at least one of oxides, nitrides, and carbides of aluminum, boron, and silicon.

In this case, the first substrate 110 and the second substrate 160 may be formed to have different sizes. That is, at least one of the volume, the thickness, or the area of one of the first substrate 110 and the second substrate 160 may be formed to be greater than that of the other one thereof. Here, the thickness may be a thickness in a direction from the first substrate 110 toward the second substrate 160, and the area may be an area in a direction perpendicular to a direction from the first substrate 110 toward the second substrate 160. Accordingly, heat absorption performance or heat dissipation performance of the thermoelectric element may be improved. Preferably, at least one of the volume, the thickness, or the area of the first substrate 110 may be formed to be greater than that of the second substrate 160. Here, in cases in which the first substrate 110 is disposed in a high-temperature region for the Seebeck effect, and the first substrate 110 is applied as a heating region for the Peltier effect, or a sealing agent for protecting a thermoelectric module, which will be described later, from the external environment is disposed on the first substrate 110, at least one of the volume, the thickness, or the area of the first substrate 110 may be greater than that of the second substrate 160. In this case, the area of the first substrate 110 may be formed in a range of 1.2 to 5 times the area of the second substrate 160. When the area of the first substrate 110 is formed to be less than 1.2 times that of the second substrate 160, the effect of improving heat transfer efficiency is not great, and when the area of the first substrate 110 is formed to be more than 5 times that of the second substrate 160, the heat transfer efficiency is significantly reduced, and the basic shape of the thermoelectric module may be difficult to maintain.

In addition, a heat dissipation pattern, for example, an irregular pattern, may be formed on a surface of at least one of the first substrate 110 and the second substrate 160. Accordingly, the heat dissipation performance of the thermoelectric element may be improved. In a case in which the irregular pattern is formed on a surface in contact with the P-type thermoelectric leg 130 or N-type thermoelectric leg 140, a bonding property between the thermoelectric leg and the substrate may also be improved.

Although not shown, a sealing member may be further disposed between the first substrate 110 and the second substrate 160. The sealing member may be disposed on side surfaces of the first electrodes 120, the P-type thermoelectric legs 130, the N-type thermoelectric legs 140, and the second electrodes 150 between the first substrate 110 and the second substrate 160. Accordingly, the first electrodes 120, the P-type thermoelectric legs 130, the N-type thermoelectric legs 140, and the second electrodes 150 may be sealed from external moisture, heat, contamination, and the like.

The descriptions of the thermoelectric element 100 according to the embodiment as described above may be applied to a thermoelectric module of a thermoelectric device or components of the thermoelectric element according to an embodiment of the present invention. A description of this will be explained below.

Figure 8:
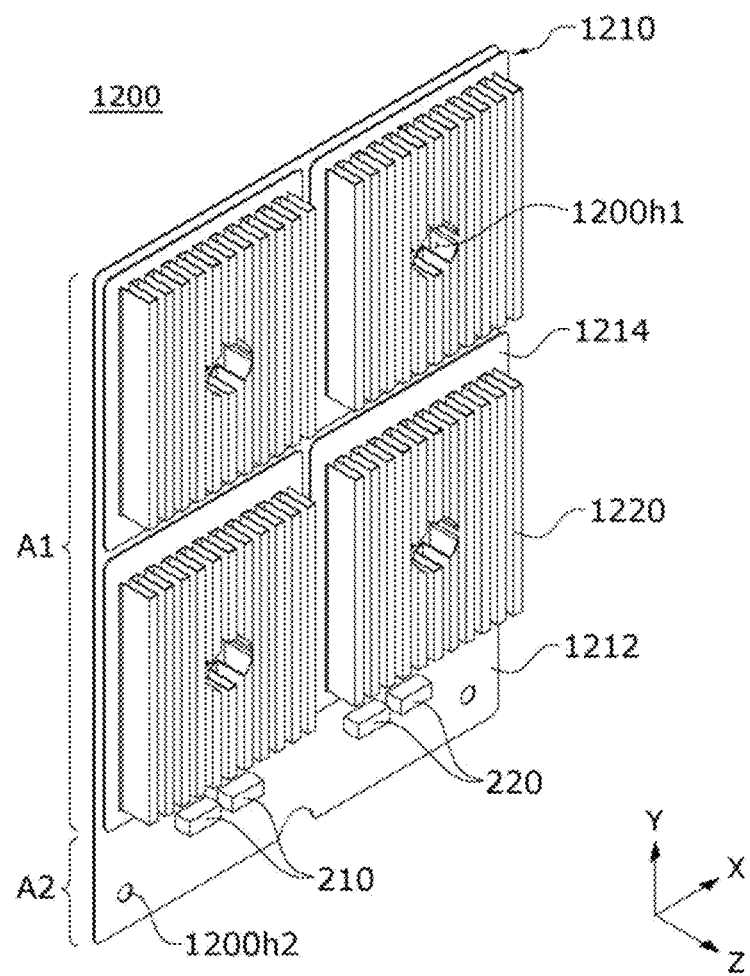
FIG. 8 is a perspective view of a thermoelectric module included in a power generator according to an embodiment of the present invention.
Figure 9:
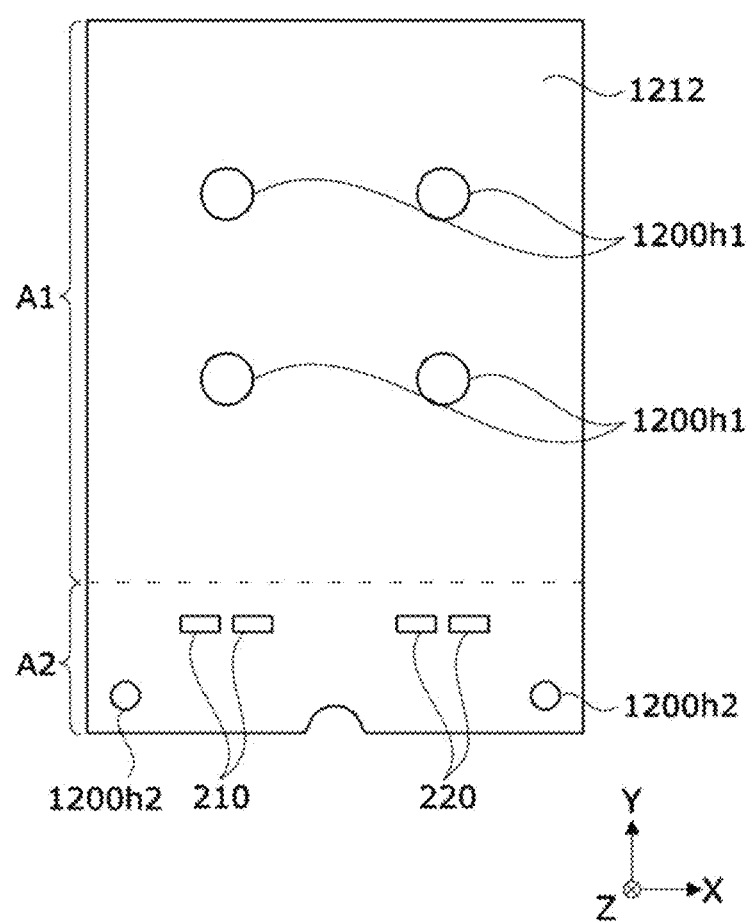
FIG. 9 is a top view of a first substrate of a thermoelectric module included in a power generator according to an embodiment of the present invention.
Figure 10:
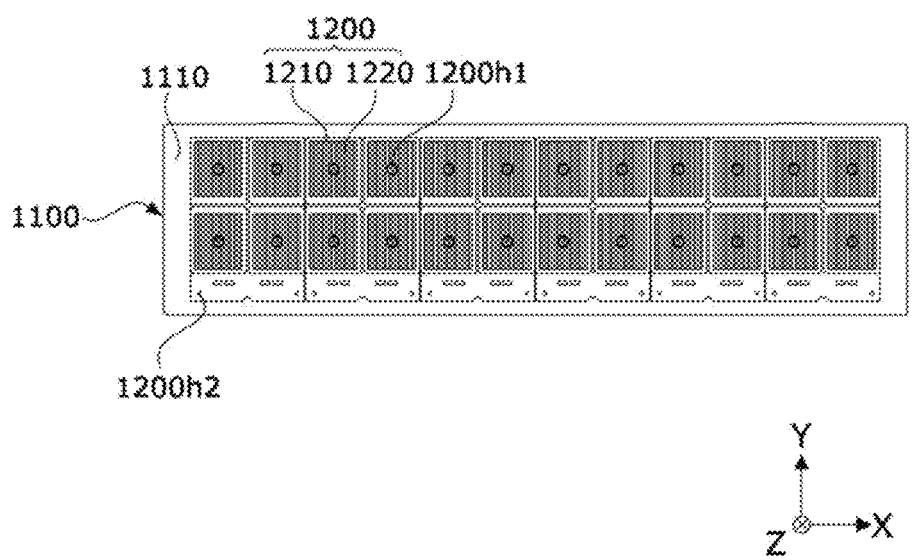
FIG. 10 is a top view in which a plurality of thermoelectric modules are disposed on one side of a fluid moving part included in a power generator according to an embodiment of the present invention.

FIG. 8 is a perspective view of a thermoelectric module included in a power generator according to an embodiment of the present invention, FIG. 9 is a top view of a first substrate of a thermoelectric module included in a power generator according to an embodiment of the present invention, and FIG. 10 is a top view in which a plurality of thermoelectric modules are disposed on one side of a fluid moving part included in a power generator according to an embodiment of the present invention.

Referring to FIGS. 8 to 10, a thermoelectric module 1200 may include a thermoelectric element 1210 and a heat sink 1220 disposed on the thermoelectric element 1210.

The thermoelectric element 1210 may be applied in the same manner as described in FIGS. 6 and 7. For example, the thermoelectric element 1210 may include a first substrate 1212 in contact with one surface (upper surface or lower surface) of the fluid moving part 1100, a second substrate (for example, upper substrate 1214) spaced apart from the first substrate 1212 in a vertical direction, a plurality of first electrodes disposed between the first substrate 1212 and the second substrate 1214, a plurality of thermoelectric legs, and a plurality of second electrodes. In this case, since the first substrate 1212, the plurality of first electrodes, the plurality of thermoelectric legs, the plurality of second electrodes, and the second substrate 1214 correspond to the plurality of first electrodes 120, the plurality of thermoelectric legs 130 and 140, the plurality of second electrodes 150, and the second substrate 160 described with reference to FIGS. 6 and 7, respectively, the above description may be applied.

In the thermoelectric element 1210 according to the embodiment, the first substrate 1212 may include a first region A1 and a second region A2. In this case, a plurality of first electrodes, a plurality of thermoelectric legs, a plurality of second electrodes, a second substrate, and a heat sink 1220 may be disposed in the first region A1. Further, the second region A2 is positioned on one side of the first region A1, and the first and second connectors 210 and 220 connected to the first electrode may be disposed in the second region A2. Each of the first and second connectors 210 and 220 may have a plurality of connectors to facilitate connection with electric wires and to easily change an electrical connection method such as series or parallel.

Further, according to an embodiment of the present invention, the fluid moving part 1100 and the thermoelectric module 1200 may be coupled to each other by fastening members such as screws. To this end, a first fastening hole is formed on the upper surface 1110 of the fluid moving part 1100 as described above, and a plurality of first fastening holes 1200$h1$ are also formed in the first region A1 of the first substrate 1212 in the thermoelectric module 1200. The plurality of first fastening holes and the plurality of first through holes 1200$h1$ may be positioned to correspond to each other. For example, the plurality of first fastening holes and the plurality of first through holes 1200$h1$ may be overlapped with each other in the vertical direction.

In addition, the first through hole 1200$h1$ may be formed not only in the first substrate 1212 but also in the second substrate (not shown) of the thermoelectric module 1200 and the heat sink 1220. The thermoelectric module 1200 and the fluid moving part 1100 may be fastened through the first through hole 1200$h1$ by screws or the like.

Meanwhile, according to an embodiment of the present invention, a plurality of second through holes 1200$h2$ may be further formed in the upper surface 1110 of the fluid moving part 1100. The second through hole 1200$h2$ may be positioned in the second region A2 of the first substrate 1212. The second through hole 1200$h2$ may be positioned to correspond to the above-described second fastening hole. For example, the second through hole 1200$h2$ may be overlapped with the second fastening hole in the vertical direction.

Further, as described above, since the cover member 1300 is disposed in the second region A2 of the first substrate 1212, the cover member 1300, the thermoelectric module 1200, and the fluid moving part 1100 may be coupled to each other through the second through hole 1200$h2$ by a fastening member (for example, screws, etc.).

With this configuration, since not only the first region A1 but also the second region A2 of the first substrate 1212 of the thermoelectric module 1200 may be coupled to the fluid moving part 1100, the entirety of the first substrate 1212 of the thermoelectric module 1200 may have an even bonding force with the fluid moving part 1100, and heat may be evenly distributed over the entirety of the first substrate 1212.

Figure 11:
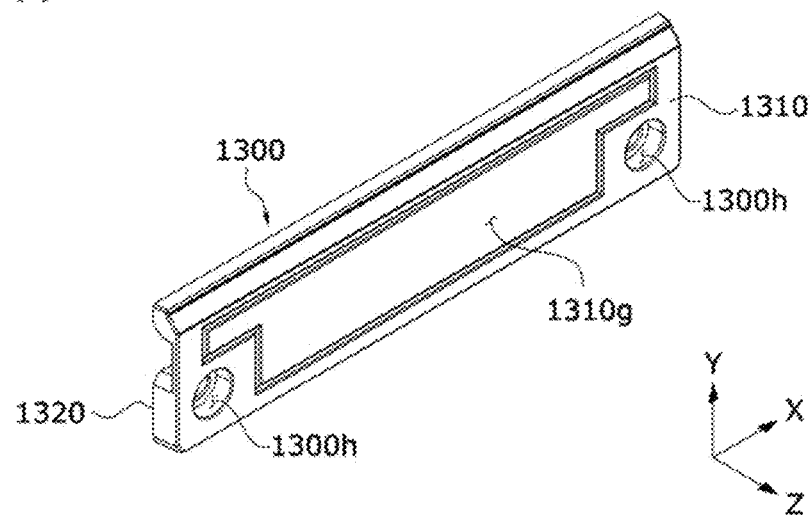
FIG. 11 is a perspective view of a cover member included in a power generator according to an embodiment of the present invention.
Figure 11:
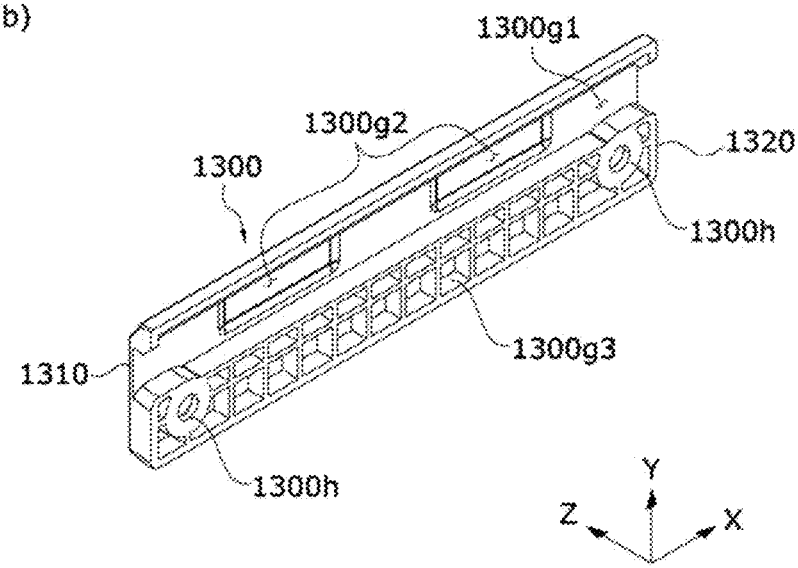
Figure 12:
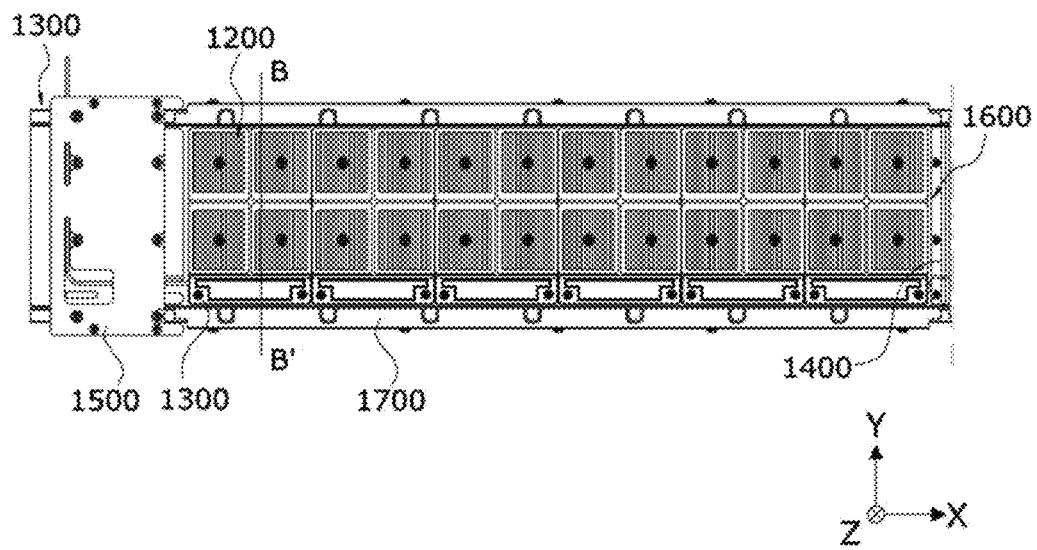
FIG. 12 is a view showing a power generator and a cover member coupled to the power generator according to an embodiment of the present invention.
Figure 13:
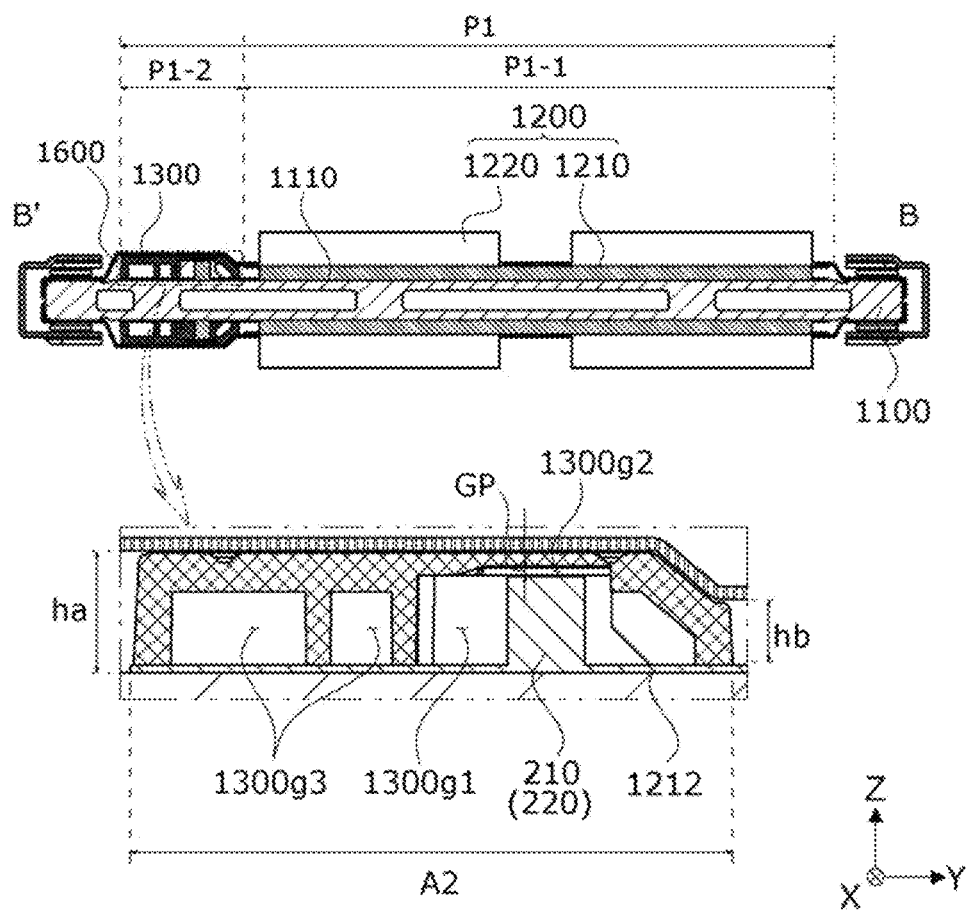
FIG. 13 is a cross-sectional view taken along a line B-B" in FIG. 12.

FIG. 11 is a perspective view of a cover member included in a power generator according to an embodiment of the present invention, FIG. 12 is a view showing a power generator and a cover member coupled to the power generator according to an embodiment of the present invention, and FIG. 13 is a cross-sectional view taken along a line B-B" in FIG. 12.

Referring to FIGS. 11 to 13, the cover member 1300 according to the embodiment may be disposed to overlap with the second region A2 of the first substrate 1212 from the thermoelectric module 1200 in the vertical direction. That is, the cover member 1300 is disposed on the second region A2 of the thermoelectric module 1200, so that the first and second connectors 210 and 220 disposed in the second region A2 may be surrounded, and wires (not shown) electrically connected to the first and second connectors 210 and 220 may be surrounded.

In addition, the cover member 1300 may be coupled to the thermoelectric module 1200 and the fluid moving part 1100 through the first fastening hole. Upon this coupling, fastening torque may be improved. In accordance with the above, the thermoelectric module 1200 may be more firmly attached to the fluid moving part 1100 even under vibration conditions.

In this case, a length of the cover member 1300 in the first direction (X-axis direction) may be the same as the length of the first substrate 1212 in the first direction (X-axis direction). For example, the length of the cover member 1300 in the first direction (X-axis direction) may be 0.9 to 1 times, preferably 0.925 to 1 times, more preferably 0.95 to 1 times the length of the first substrate 1212, in which the cover member 1300 is disposed, in the first direction (X-axis direction). With this configuration, since the cover member 1300 presses the entirety of the length of the first substrate 1212 in the first direction, deformation or detachment of the first substrate 1212 may be prevented.

In addition, the cover member 1300 may include an upper surface groove 1310g disposed on the upper surface 1310 thereof. A sealing agent may be applied to the upper surface groove 1310g. Accordingly, bonding and sealing between the upper surface 1310 of the cover member 1300 and the shield member 1600 on the cover member 1300 may be performed. Accordingly, foreign substances, moisture, and the like penetrating between the shield member 1600 and the cover member 1300 may be blocked. As a result, electrical stability of the thermoelectric module 1200 may be improved.

In addition, the cover member 1300 may include a plurality of cover holes 1300h. A cover hole 1300h may be positioned to correspond to the above-described second through hole of the thermoelectric module. That is, the cover hole 1300h may be overlapped with the second through hole in the vertical direction. In addition, the second through hole may be positioned to correspond to the first fastening hole of the fluid moving part. Accordingly, the first fastening hole, the second through hole, and the cover hole 1300h may be overlapped with each other in the vertical direction, and thus, the fluid moving part 1100, the thermoelectric module 1200, and the cover member 1300 may be coupled by the fastening member.

Further, the cover hole 1300h may be formed on both sides of the cover member 1300 to support both sides of the second region A2 of the first substrate 121 in a balanced way and to prevent thermal deformation of the first substrate 1212. In this case, the distance between the two cover holes 1300h in one cover member 1300 may be greater than the distance between the two first through holes in the thermoelectric module 1200. With this configuration, the cover member 1300 may uniformly and evenly support both sides of the second region A2 of the first substrate 1212.

In addition, a first cover groove 1300g1 and a second cover groove 1300g2 may be disposed on the lower surface 1320 of the cover member 1300. The second cover groove 1300g2 may be positioned in the first cover groove 1300g1 and overlapped with the first cover groove 1300g1 in the vertical direction.

The first cover groove 1300g1 is extended in the first direction (X-axis direction) and may be spaced apart from the cover hole 1310h of the first substrate 1212 in the second direction (Y-axis direction). Conductive wires and first and second connectors 210 and 220 may be positioned in the first cover groove 1300g1. In addition, the conductive wires may be disposed along the first cover groove 1300g1 of the plurality of cover members 1300 adjacent to each other to electrically connect the thermoelectric modules 1200 adjacent to each other.

In an embodiment, the first cover groove 1300g1 may be overlapped with the second region A2 of the first substrate 1212 in the vertical direction, and in particular, may also be overlapped with the first and second connectors 210 and 220 in the vertical direction. In particular, the second cover groove 1300g2 may be positioned to correspond to the first and second connectors 210 and 220. For example, the second cover groove 1300g2 may be overlapped with the first and second connectors 210 and 22 in the vertical direction.

Furthermore, a gap region GP between the first and second connectors 210 and 220 and the bottom surface of the second cover groove 1300g2 may exist due to the second cover groove 1300g2. Accordingly, compatibility with respect to size may be improved while protecting the first and second connectors 210 and 220.

In addition, the cover member 1300 may include a plurality of third cover grooves 1300g3 disposed between the cover holes 1300h spaced apart from each other. The heights (lengths in the vertical direction) of the plurality of third cover grooves 1300g3 may be different from those of the first cover grooves 1300g1 and the second cover grooves 1300g2. For example, the height (length in the vertical direction) of the plurality of third cover grooves 1300g3 may be smaller than the heights of the first cover groove 1300g1 and the second cover groove 1300g2.

In addition, a bonding member for facilitating fastening between the first substrate 1212 and the cover member 1300 may be applied to the third cover groove 1300g3. Accordingly, bonding force between the cover member 1300 and the thermoelectric module 1200, particularly, the first substrate 1212 may be improved.

In addition, since the cover member 1300 is disposed in the second region A2 on the first substrate 1212 and coupled to the fluid moving part 1100 through the cover hole 1300h as described above, a lifting phenomenon between the fluid moving part 1100 and the first substrate 1212 may be suppressed in the second region A2.

Further, the cover member 1300 according to the embodiment may include an insulating material, for example, a plastic material. In accordance with the above, since a head of the fastening member is in contact with the cover member 1300, the first substrate 1212 including metal and the head of the fastening member may be insulated from each other, and a withstand voltage performance of the thermoelectric module 1200 may be improved.

In addition, when the cover member 1300 includes a plastic material, the cover member 1300 may be easily molded into various sizes and shapes. More specifically, the cover member 1300 may be a plastic material applicable at high temperatures, such as polyphenylene sulfide (PPS). In accordance with the above, it is possible to prevent a problem in which the shape of the cover member 1300 is deformed by the second fluid having a high-temperature.

In addition, the first part P1 of the shield member 1600 may include a first-first part P1-1 and a first-second part P1-2. The first-first part P1-1 may be overlapped with the first region of the thermoelectric module 1200 in the vertical direction. Further, the first-second part P1-2 may be overlapped with the second region A2 of the thermoelectric module 1200 in the vertical direction. The above-described cover member and the first and second connectors may be disposed below the first-second part P1-2. In addition, a height hb of the first-first part P1-1 from the upper surface 1110 of the fluid moving part 1100 in the vertical direction may be less than a height ha between the first-second part P1-2 and the upper surface 1110 of the fluid moving part 1100 in the vertical direction. With this configuration, the inclination angle of the stepped part of the shield member may be increased through the height difference of the first part as described above. Accordingly, the thermal resistance of the fluid by the first-second part P1-2 is increased, so that the fluid may be stayed on the first part P1 for a longer time. Accordingly, thermal efficiency of the thermoelectric device according to the embodiment may be improved. Furthermore, a space for the first and second connectors 210 and 220 and wires may be easily secured.

Figure 14:
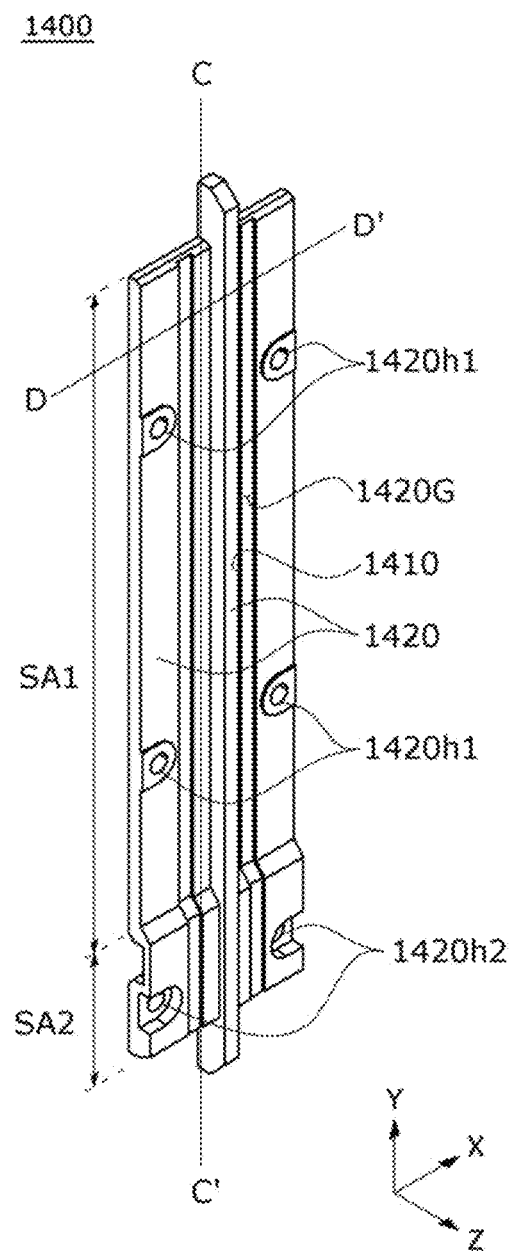
FIGS. 14 and 15 are perspective views of a guide part included in a power generator according to an embodiment of the present invention.
Figure 15:
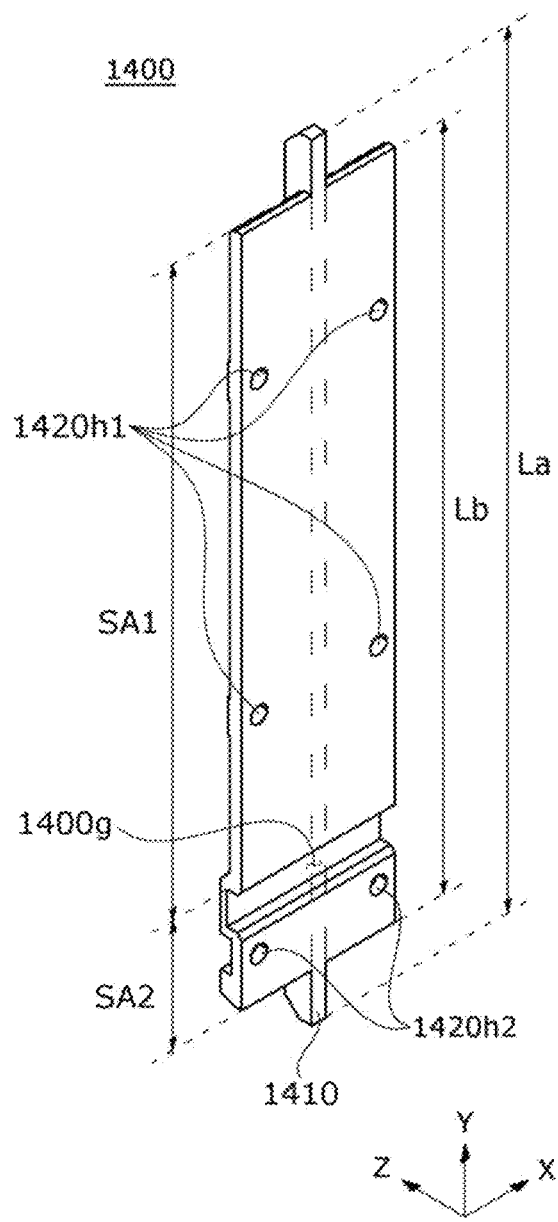
Figure 16:
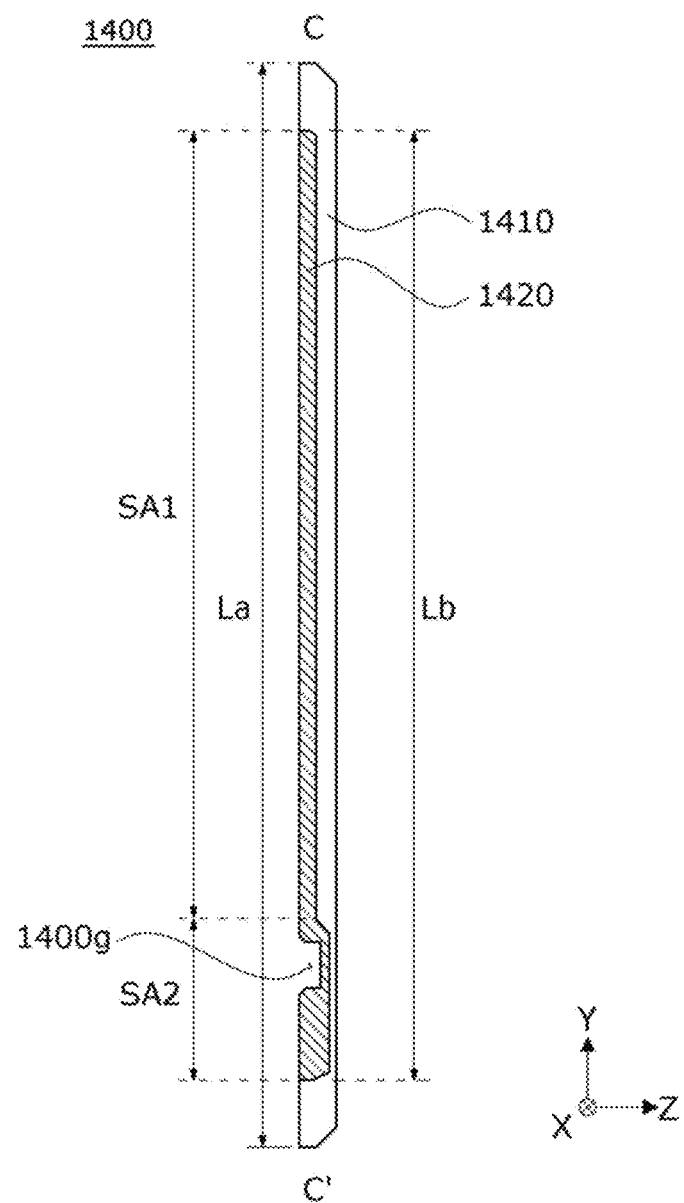
FIG. 16 is a view viewed from a line C-C' in FIG. 14.
Figure 17:
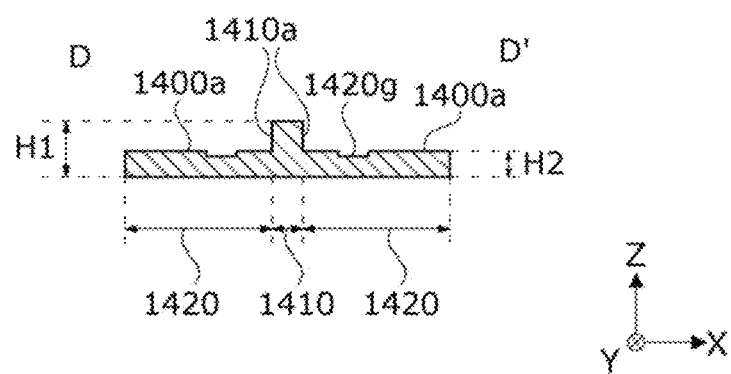
FIG. 17 is a cross-sectional view taken along a line D-D' in FIG. 14.

FIGS. 14 and 15 are perspective views of a guide part included in a power generator according to an embodiment of the present invention, FIG. 16 is a view viewed from a line C-C' in FIG. 14, and FIG. 17 is a cross-sectional view taken along a line D-D' in FIG. 14.

Referring to FIGS. 14 to 17, in the thermoelectric device according to the embodiment, a guide part 1400 may be disposed between the shield members adjacent to each other. Accordingly, the guide part 1400 may be at least partially overlapped with the shield member in the vertical direction. In addition, the guide part 1400 may be disposed between thermoelectric modules groups adjacent to each other. For example, the guide part 1400 may be disposed to be spaced apart from the thermoelectric module groups adjacent to each other in a first direction (X-axis direction).

More specifically, the guide part 1400 may include a central part 1410 and a support part 1420 that is in contact with the central part 1410 and disposed to be spaced apart from the central part 1410 in the first direction (X-axis direction). The support part 1420 may be in contact with the central part 1410 and may be extended from a side surface of the central part 1410 in the first direction (X-axis direction) or in a direction opposite to the first direction (X-axis direction).

The central part 1410 may be positioned on a bisector in the first direction (X-axis direction) from the guide part 1400. The central part 1410 is disposed at the center of the guide part 1400, and two support parts 1420 spaced apart from each other may be symmetrically disposed with respect to the central part 1410. For example, the central part 1410 may be disposed between shield members adjacent to each other. Accordingly, in the guide part 1400, a support force for an upper shield member may be applied in a balanced manner without being concentrated on one side with respect to the central part 1410. As a result, reliability of the guide part 1400 may be improved.

In addition, the central part 1410 may have a length La in a second direction (Y-axis direction) greater than a length in a second direction (Y-axis direction) between the groove parts disposed to be spaced apart from each other on the upper surface of the fluid moving part. Accordingly, at least a portion of the central part 1410 may be overlapped with the groove part of the fluid moving part in the vertical direction. Thus, the central part 1410 may guide the second sealing member on the support part 1420 to be extended into the groove part of the fluid moving part. Furthermore, the length of the support part 1420 in the second direction (Y-axis direction) may be smaller than the length between the groove parts disposed to be spaced apart from each other on the upper surface of the fluid moving part in the second direction (Y-axis direction). Accordingly, the second sealing member disposed on the upper surface of the support part 1420 may be extended to an inclined side of the support part 1420. Furthermore, the second sealing member may be guided along the side surface by the inclined side surface of the support part 1420 and may be easily extended to the groove part of the fluid moving part positioned on the lower portion thereof. Thus, the connection between the second sealing member and the first sealing member may be easily performed. That is, the sealing effect may be improved at an edge of the shield member, particularly at a bent portion by the first sealing member and the second sealing member.

Further, the support part 1420 may be in contact with the side surface of the central part 1410. A height H1 of the central part 1410 in the vertical direction may be different from a height H2 of the support part 1420 in the vertical direction. The height H1 of the central part 1410 in the vertical direction may be greater than the height H2 of the support part 1420 in the vertical direction.

In addition, a length La of the support part 1420 in the second direction (Y-axis direction) may be different from a length Lb of the central part 1410 in the second direction (Y-axis direction). The length La of the support part 1420 in the second direction (Y-axis direction) may be smaller than the length Lb of the central part 1410 in the second direction (Y-axis direction). Thus, the central part 1410 may easily guide the second sealing member along the side surface of the central part 1410 to the inclined side surface of the above-described support part 1420.

Accordingly, the central part 1410 may have a structure protruding in the second direction (Y-axis direction) and in the vertical direction compared to the support part 1420. As a result, as will be described later, when the second sealing member is applied on the support part and sealed between the shield member and the guide part with the second sealing member, overflow of the second sealing member to the support parts 1420 spaced apart from each other may be prevented. Moreover, the central part 1410 may prevent the shield members adjacent to each other from being in contact with each other. Furthermore, the central part 1410 may guide a position of the second sealing member so that the second sealing member passes through the support part 1420 and faces the groove part of the fluid moving part. Further, the first sealing member and the second sealing member on the groove part of the fluid moving part may be in contact with each other to perform outside sealing of the entirety of the plurality of thermoelectric modules disposed below one shield member. In addition, the second sealing member may be extended to the thermoelectric module therein, so that the sealing member may be applied in the guide groove. Accordingly, reliability of the plurality of thermoelectric modules may be improved.

Further, the height H2 of the support part 1420 in the vertical direction may correspond to a height of the thermoelectric element. For example, the height H2 of the support part 1420 in the vertical direction may be the same as the height of the thermoelectric element. Accordingly, since the shield member does not have a step difference on the surface in contact with the guide part 1400 and the thermoelectric element, it is possible to provide ease of process and to solve the difficulty of sealing due to the step difference.

In addition, at least a portion of the support part 1420 is disposed below the shield member, and the upper surface of the support part 1420 may face the shield member.

The guide part 1400 may include a plurality of guide holes. For example, the support part 1420 of the guide part 1400 may include a first guide hole 1420*h*1 and a second guide hole 1420*h*2. There may be a plurality of first guide holes 1420*h*1 and a plurality of second guide holes 1420*h*2, which may be symmetrically disposed with respect to the central part 1410. Accordingly, when the guide part 1400 is coupled to the fluid moving part, a force due to fastening may be uniformly applied to the guide part 1400 and the fluid moving part. As a result, it is possible to easily prevent a phenomenon in which the guide part is lifted from the upper surface of the fluid moving part.

In addition, according to the embodiment, the guide part 1400 may include a first guide region SA1 disposed on one side and a second guide region SA2 disposed on another side. The first guide region SA1 may correspond to the first region in the thermoelectric module. For example, the first guide region SA1 may be overlapped with the first region of the adjacent thermoelectric module in a first direction (X-axis direction). In addition, the second guide region SA2 may be disposed at a side opposite to the second direction (Y-axis direction) from the first guide region SAL The second guide region SA2 may be overlapped with the second region of the adjacent thermoelectric module in the first direction (X-axis direction).

The above-described first guide hole 1420*h*1 may be disposed in the first guide region SA1. For example, the first guide hole 1420*h*1 may be positioned to correspond to the first through hole of the first region. That is, the first guide hole 1420*h*1 may be overlapped with the first through hole in the first direction (X-axis direction). Accordingly, it is possible to easily manufacture the fluid hole of the fluid moving part by the first guide hole 1420*h*1.

Further, the second guide hole 1420*h*2 may be disposed in the second guide region SA2. For example, the second guide hole 1420*h*2 may be positioned to correspond to the second through hole to be overlapped with the second through hole in the first direction (X-axis direction). Accordingly, the fastening between the guide part 1400 and the fluid moving part may be made corresponding to the fastening between the thermoelectric module and the fluid moving part. Thus, the formation of the fastening holes and through-holes described above may be easily accomplished, and the fabrication of the fluid holes in the fluid moving part may also be easily performed, and the first fluid may be easily moved in the first direction (X-axis direction).

In addition, the guide part 1400 according to the embodiment may include a guide groove 1400*g* formed on a bottom surface thereof. The guide groove 1400*g* may be positioned in the second guide region SA2. This guide groove 1400*g* may be positioned to correspond to the above-described first cover groove. For example, the guide groove 1400*g* may be overlapped with the first cover groove in a first direction (X-axis direction). With this configuration, electric wires connected to the first and second connectors in the first cover groove may be passed through the guide groove 1400*g* to electrically connect thermoelectric modules disposed below the shield members adjacent to each other. The guide groove 1400*g* may have the same height in the vertical direction as that of the first cover groove in the vertical direction. Thus, bending of the electric wire or the like may be prevented.

In addition, the second sealing member may be partially disposed in the guide groove 1400*g*. In addition, since the second sealing member is disposed in the guide groove 1400*g*, the wire positioned in the guide groove 1400*g* may be bonded to the second sealing member. As a result, the position of the wire is fixed by the second sealing member, so that vibration may be suppressed, and damage due to movement and impact may be prevented. That is, the reliability of the wire may be improved. Further, the support part 1420 may have a stepped region corresponding to the cover member 1300. That is, a height of the support part 1420 in the first guide region SA1 in the vertical direction may be smaller than a height of the support part 1420 in the second guide region SA2 in the vertical direction. Accordingly, since the height of the cover member 1300 is greater than the height of the thermoelectric element, the support part 1420 also has the difference in height described above. Thus, the support part 1420 may have a stepped structure at a portion adjacent to the second region.

In addition, the guide part 1400 according to the embodiment may include a groove part 1420*g* disposed on an upper surface 1400*a*. The groove part 1420*g* of the guide part 1400 may be disposed on the support part 1420. Accordingly, the groove part 1420*g* of the guide part 1400 may be overlapped with each of the spaced shield members in the vertical direction.

The groove part 1420*g* of the guide part 1400 may be disposed on an upper surface of the support part 1420 and may be symmetrically disposed with respect to the central part 1410. For example, the groove part 1420*g* of the guide part 1400 may be two. However, it is not limited to these numbers.

In addition, the groove part 1420*g* of the guide part 1400 may be disposed closer to the central part 1410 than to the outer surface of the guide part 1400. For example, a distance d1 between the groove part 1420*g* of the guide part 1400 and the outer surface of the guide part 1400 may be different from a distance d2 between the groove part 1420*g* of the guide part 1400 and the central part 1410. The distance d1 between the groove part 1420*g* of the guide part 1400 and the outer surface of the guide part 1400 may be greater than the distance d2 between the groove part 1420*g* of the guide part 1400 and the central part 1410. With this configuration, the second sealing member applied to the groove part 1420*g* of the guide part 1400 may be easily moved toward the central part 1410 when the shield member is seated on the guide part 1400. Accordingly, the second sealing member may be disposed between a bottom surface of the shield member and the upper surface 1400*a* of the guide part 1400 and between a side surface of the shield member and a side surface 1410*a* of the central part 1410. As a result, sealing between the guide part 1400 and the shield member may be accurately performed by the second sealing member without an empty region. A detailed description of this will be explained later.

Figure 18:
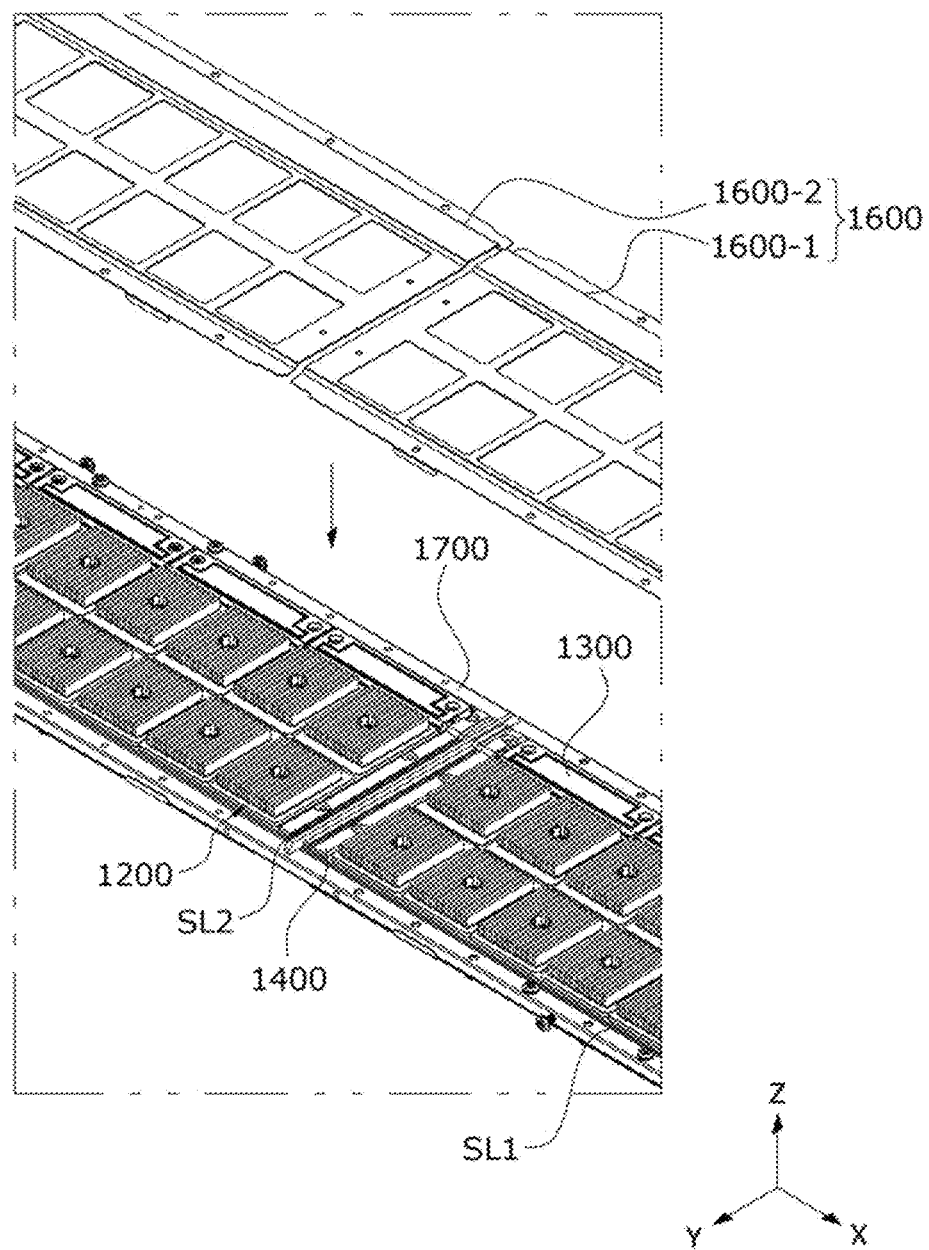
FIGS. 18 and 19 are views explaining a coupling of shield members in a power generator according to an embodiment of the present invention.
Figure 19:
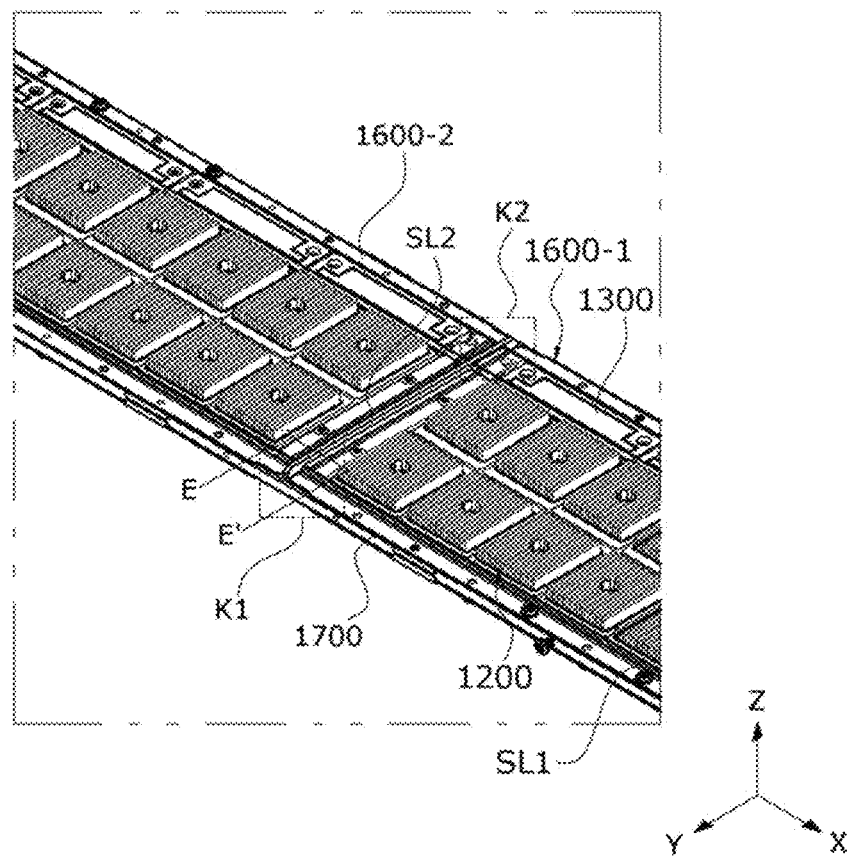
Figure 20:
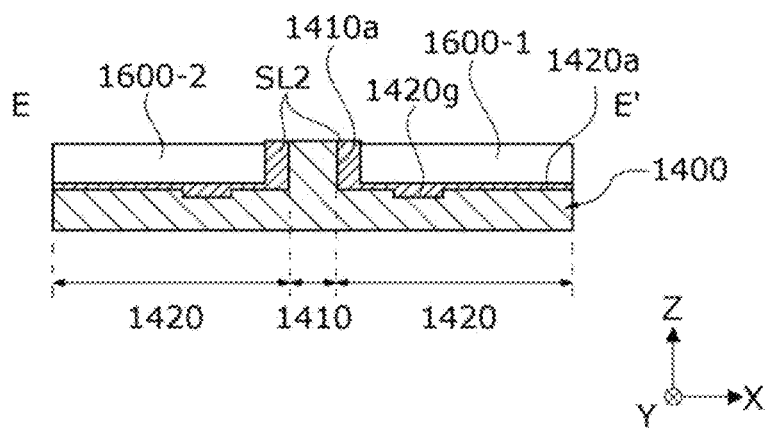
FIG. 20 is a cross-sectional view taken along a line E-E" in FIG. 19.
Figure 21:
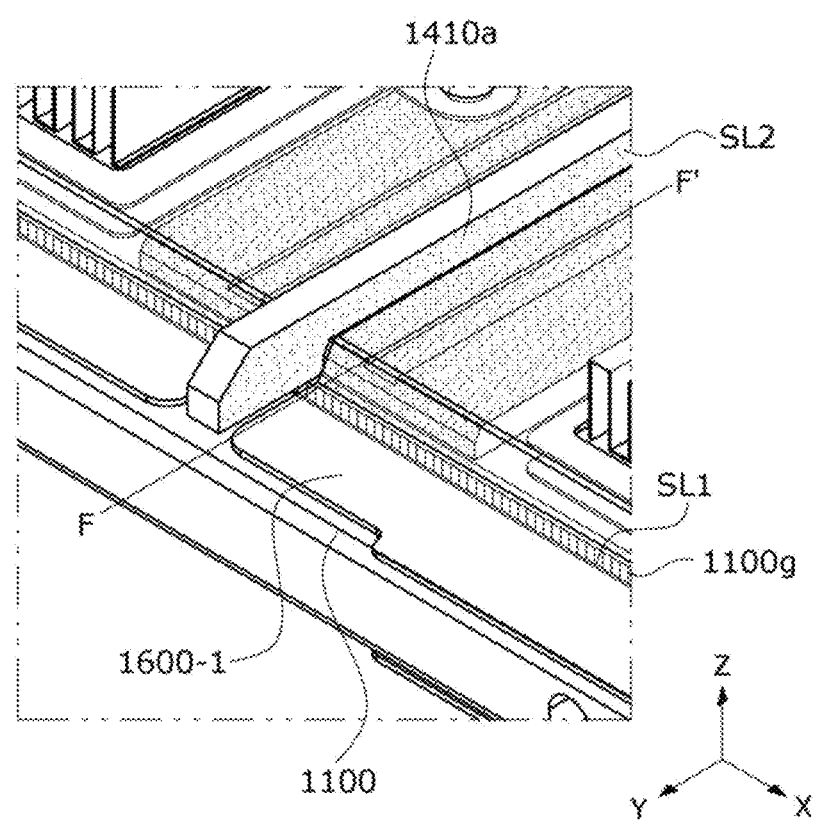
FIG. 21 is an enlarged view of a portion K1 in FIG. 19.
Figure 22:
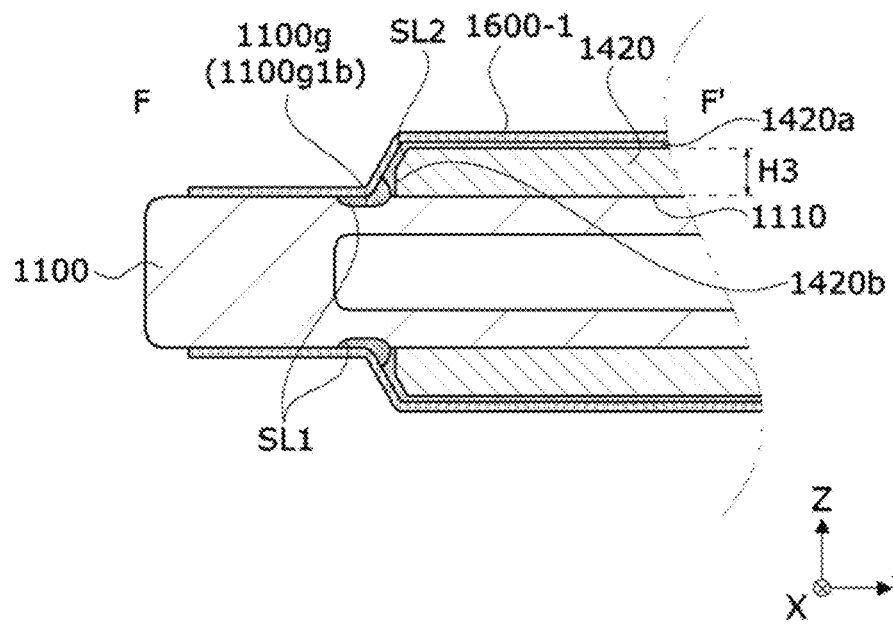
FIG. 22 is a cross-sectional view taken along a line F-F" in FIG. 21.
Figure 23:
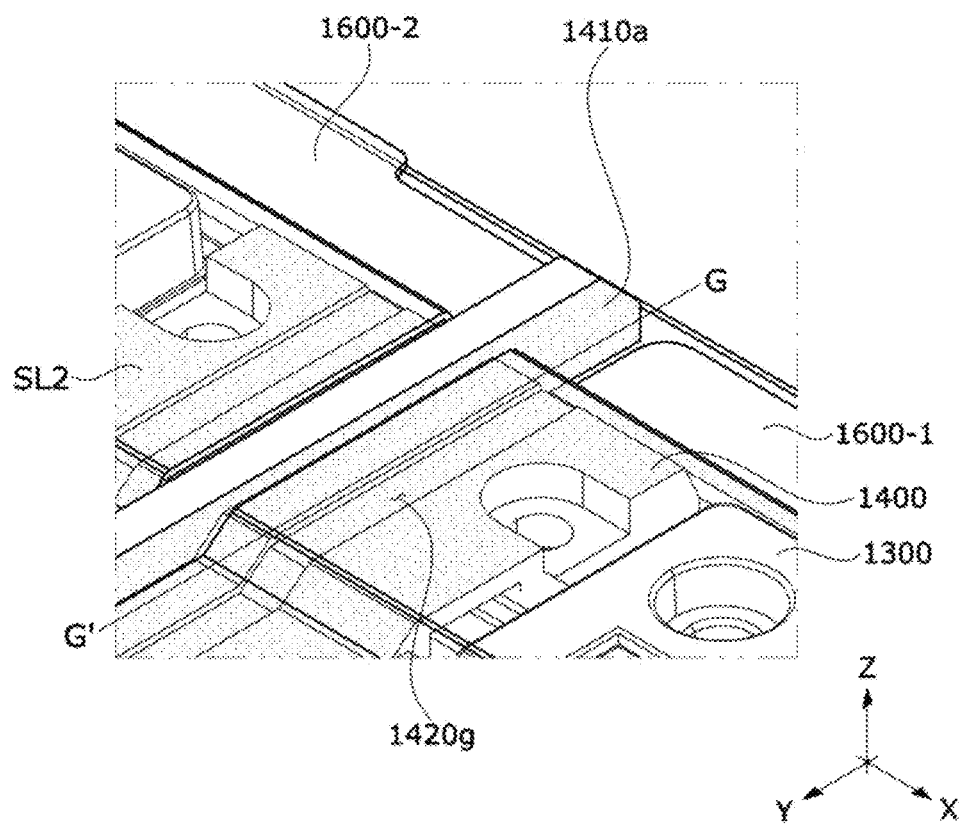
FIG. 23 is an enlarged view of a portion K2 in FIG. 19.
Figure 24:
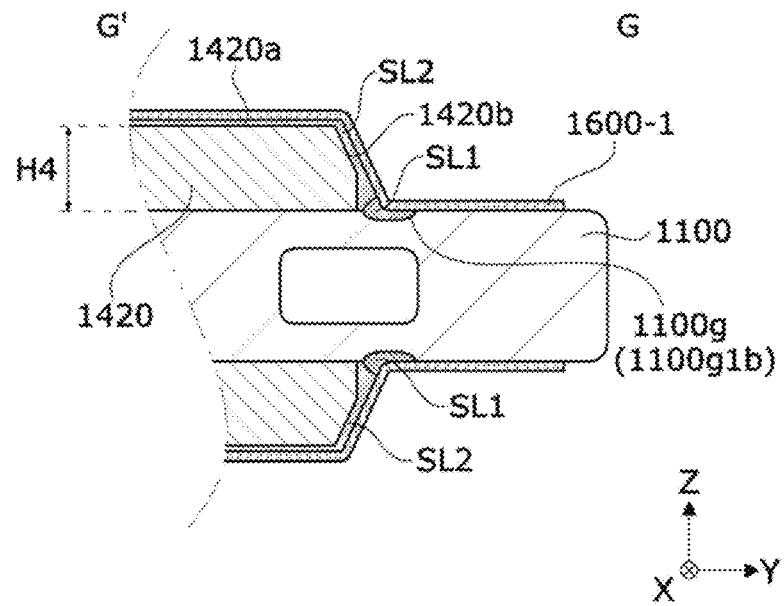
FIG. 24 is a cross-sectional view taken along a line G-G' in FIG. 23.

FIGS. 18 and 19 are views explaining a coupling of shield members in a power generator according to an embodiment of the present invention; FIG. 20 is a cross-sectional view taken along a line E-E" in FIG. 19; FIG. 21 is an enlarged view of a portion K1 in FIG. 19; FIG. 22 is a cross-sectional view taken along a line F-F" in FIG. 21; FIG. 23 is an enlarged view of a portion K2 in FIG. 19; and FIG. 24 is a cross-sectional view taken along a line G-G' in FIG. 23.

Referring to FIGS. 18 and 19, after a plurality of thermoelectric modules 1200, a plurality of cover members 1300, a guide part 1400, and a dummy module (not shown) are disposed on a fluid moving part, a shield member 1600 is seated, so that the thermoelectric module 1200 may be protected from external moisture and contaminants by the shield member 1600. In this case, for more accurate sealing, after a first sealing member SL1 is applied to a groove part of the fluid moving part and a second sealing member SL2 is applied to a groove part of the guide part 1400, the shield member 1600 may be seated. Accordingly, the first sealing member and the second sealing member SL2 are disposed in a space between the shield member 1600 and the fluid moving part and in a space between the guide part 1400 and the shield member, so that sealing may be achieved. It should be understood that some of the illustrated fastening members (e.g., screws) may be equally disposed in the holes of each component on the drawings. In addition, the guide part 1400 may be disposed between the plurality of shield members 1600-1 and 1600-2 adjacent to each other or between the plurality of thermoelectric module groups adjacent to each other, as described above.

Further, the second sealing member SL2 is applied on the groove part of the guide part 1400 and may be moved to the upper surface and the side surface of the support part and the side surface of the central part by the shield member 1600. A detailed description of this will be explained later.

Referring to FIG. 20, the guide part 1400 may be disposed between one shield member 1600-1 and another shield member 1600-2 adjacent to each other. Further, at least a partial region of the support part 1420 may be overlapped with the shield member 1600 in a vertical direction. The central part 1410 may be offset from the shield member 1600 in the vertical direction and disposed to be spaced apart in a first direction (X-axis direction).

The second sealing member SL2 may be disposed on the groove part 1420g of the guide part 1400 and an upper surface 1420a of the support part 1420. The upper surface 1420a of the support part 1420 may face an upper shield member 1600. Furthermore, the second sealing member SL2 may also be disposed on the side surface 1410a of the central part 1410. The side surface 1410a of the central part 1410 may be a surface in contact with the upper surface 1420a of the support part 1420. Accordingly, the second sealing member SL2 may be disposed between the bottom surface of the shield member 1600 and the upper surface 1420a of the support part 1420 and between the side surface of the shield member 1600 and the side surface 1410a of the central part 1410. As a result, penetration of moisture or contaminants from the outside of the shield member 1600 into a region between the guide part 1400 and the shield member 1600 may be suppressed.

In addition, the sealing members (for example, first to third sealing members) described in this specification may be made of a heat-resistant and moisture-resistant material. For example, the sealing members may include a sealing material, a sealing tape or the like containing heat-resistant silicon.

Referring to FIGS. 21 to 24, the second sealing member SL2 may be disposed on the upper surface and side surface of the guide part 1400 as described above. For example, the second sealing member SL2 may also be disposed on the side surface 1420b of the support part 1420, so that the second sealing member SL2 may be in contact with the side surface 1420b of the support part 1420.

In addition, the side surface 1420b of the support part 1420 may be disposed adjacent to the groove part 1100g of the fluid moving part 1100. Accordingly, the first sealing member SL1 on the groove part 1100g of the fluid moving part 1100 and the second sealing member SL2 disposed on the side surface 1420b of the support 1420 may be connected to each other. That is, the second sealing member SL2 and the first sealing member SL1 may be connected to each other by the guide part 1400. As a result, penetration of contaminants between the plurality of shield members 1600-1 and 1600-2 adjacent to each other may be blocked by the first sealing member SL1 and the second sealing member SL2.

The groove part 1100g of the fluid moving part 1100 and the side surface 1420a of the support part 1420 in the guide part 1400 may be spaced apart from each other in the second direction (Y-axis direction). In addition, at least a portion of the central part may be overlapped with the groove part 1100g of the fluid moving part 1100 in the vertical direction. Accordingly, the central part 1410 may guide the second sealing member SL2 to be moved toward the groove part 1100g of the fluid moving part 1100 along the side surface 1410a of the central part 1410. As a result, the central part 1410 may induce contact between the first sealing member SL1 and the second sealing member SL2, so that an empty area between the shield member 1600, the fluid moving part 1100, and the guide part 1400 may be removed and thus accurate sealing may be achieved.

In addition, since the support part 1420 has a stepped region corresponding to the cover member 1300 as described above, a height H3 of the support part 1420 in the first guide region in the vertical direction may be smaller than a height H4 the support part 1420 in the second guide region in the vertical direction.

In addition, as described above, the thermoelectric module, the cover member, the guide part, the dummy module, and the shield member are correspondingly positioned on the lower surface as well as the upper surface of the fluid moving part 1100.

In addition, the groove part 1420g of the guide part 1400 may be disposed between the groove parts 1100g of the fluid moving parts 1100 spaced apart from each other in the second direction (Y-axis direction). For example, the groove part 1420g of the guide part 1400 may be disposed inside the groove parts 1100g of the fluid moving parts 1100 spaced apart from each other. Accordingly, the first sealing member SL1 and the second sealing member SL2 may be easily connected to each other.

Figure 25:
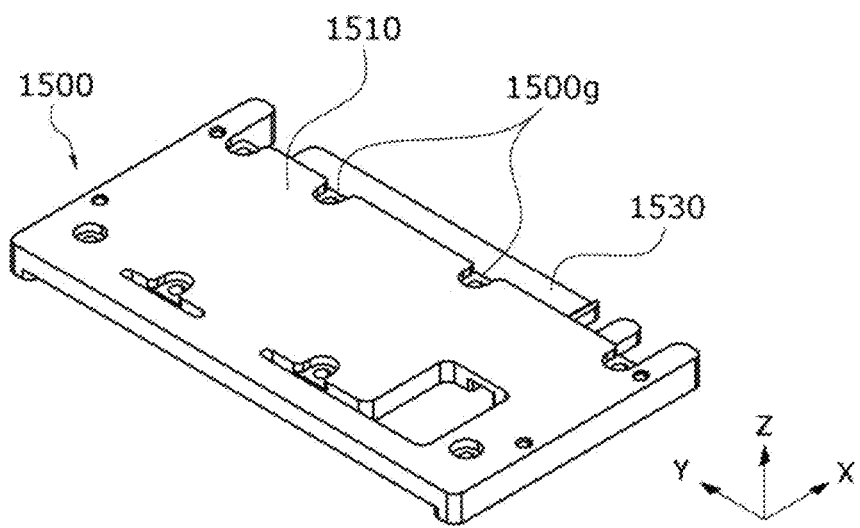
FIGS. 25 and 26 are perspective views of a dummy module included in a power generator according to an embodiment of the present invention.
Figure 26:
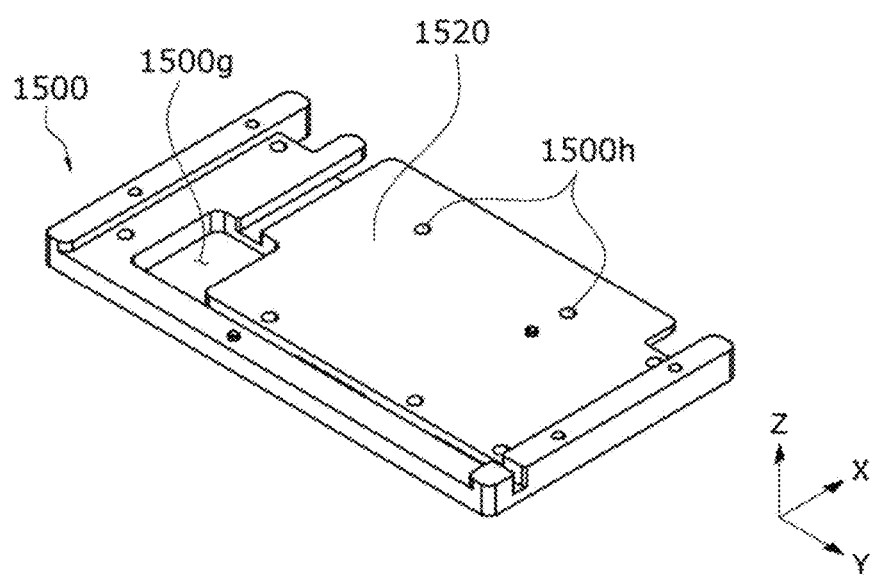
Figure 27:
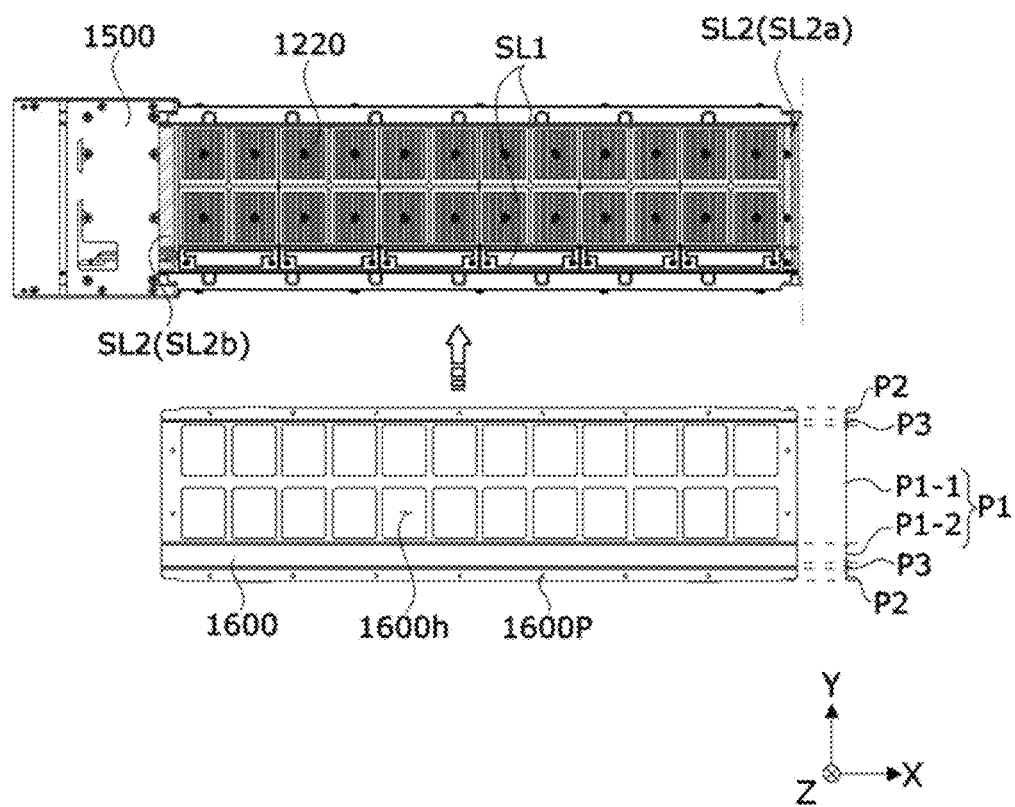
FIGS. 27 and 28 are views explaining a coupling of shield members in a power generator according to an embodiment of the present invention.
Figure 28:
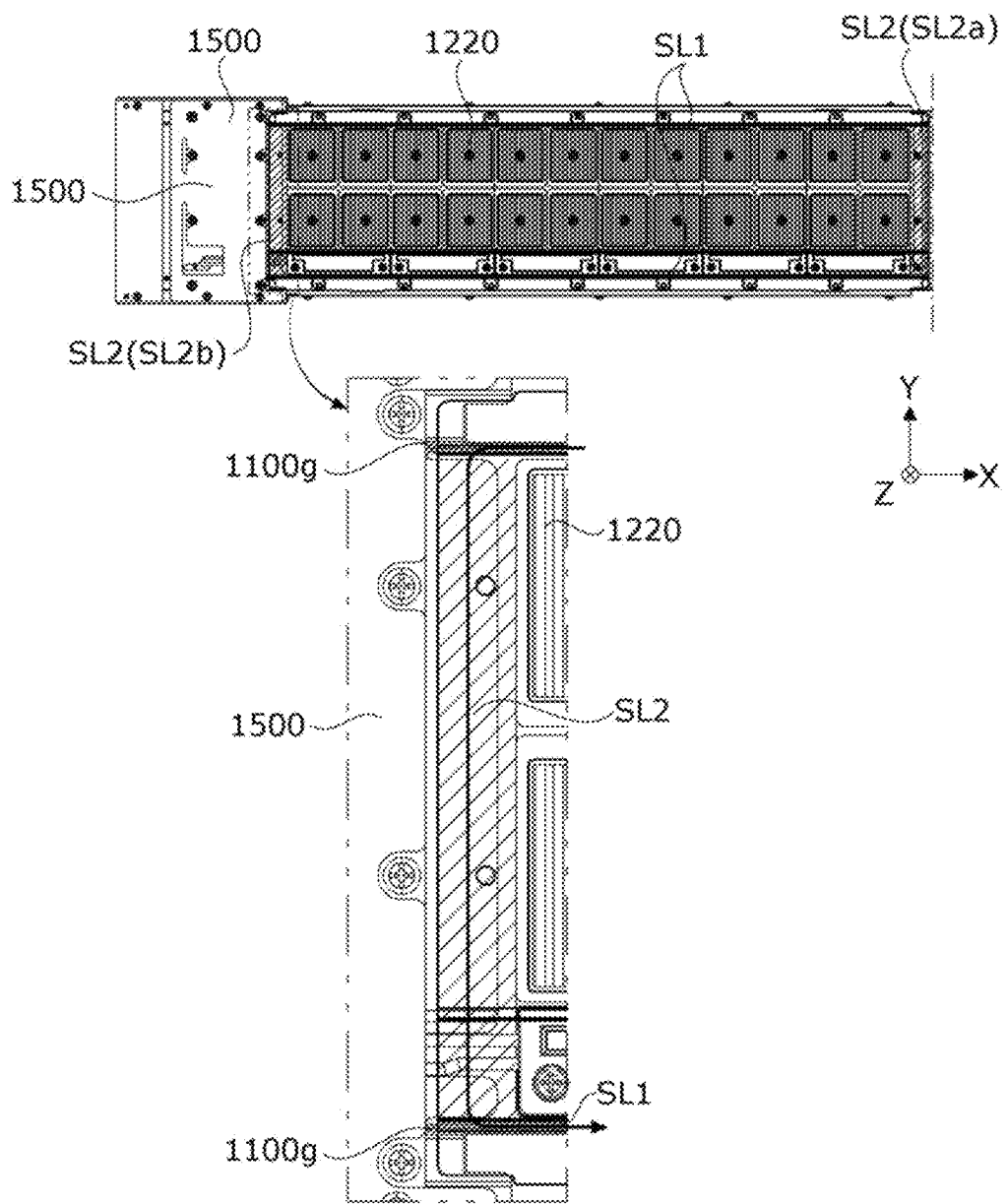

FIGS. 25 and 26 are perspective views of a dummy module included in a power generator according to an embodiment of the present invention, and FIGS. 27 and 28 are views explaining a coupling of shield members in a power generator according to an embodiment of the present invention.

Referring to FIGS. 25 to 28, a power generator according to the embodiment may include a dummy module 1500 disposed on a fluid moving part 1100.

The dummy module 1500 may be disposed on one side or another side of one surface (for example, the upper or lower surface) of the fluid moving part 1100. For example, the dummy module 1500 may be disposed outside the thermoelectric modules 1200 arranged side by side in the first direction (X-axis direction). For example, the dummy module 1500 may be disposed at both ends of one surface of the fluid moving part 1100, and a plurality of thermoelectric modules 1200 may be disposed between the two dummy modules 1500. Accordingly, the dummy module 1500 may be at least partially overlapped with the plurality of thermoelectric modules 1200 in the first direction (X-axis direction).

The dummy module 1500 may include an upper surface 1510 and a lower surface 1520. The upper surface 1510 of the dummy module 1500 may have a stepped structure.

In addition, a module groove 1500*g* may be positioned on the lower surface 1520 of the dummy module 1500.

Meanwhile, according to an embodiment of the present invention, electric wires connected to the connectors may be guided using the dummy module 1500. Accordingly, the dummy module according to the embodiment of the present invention may be a guide module. For example, the module groove 1500*g* of the dummy module 1500 may be extended from the adjacent thermoelectric module 1200 and bent in a first direction to be extended in a second direction (Y-axis direction).

More specifically, the respective dummy modules 1500 disposed on one side and another side of the upper surface 1110 of the fluid moving part 1100 may include module grooves 1500*g* extended in a first direction (X-axis direction). These module grooves 1500*g* may be positioned to correspond to a first cover groove and a second cover groove of the above-described cover member 1300. For example, the module groove 1500*g* may be overlapped with the first cover groove in the first direction (X-axis direction).

Accordingly, wires connected to the connectors 210 and 220 may be guided through the module groove 1500*g* in the first direction. Thus, the wires connected to the connectors 210 and 220 disposed in a second region A2 of the first substrate 1212 may be accommodated and fixed in the module groove 1500*g* along the first direction.

Further, the module groove 1500*g* may be bent outside and extended in a second direction or in a direction opposite to the second direction. Accordingly, the wires may be guided toward the outside of the dummy module 1500 along the module groove 1500*g*. Thus, the wire may be extended to the outside of the power generator, and the wire may be electrically connected to an external circuit or battery.

In addition, the dummy module 1500 may include a plurality of through holes 1500*h*. The plurality of through holes 1500*h* may be positioned to correspond to the first fastening holes of the fluid moving part 1100. That is, the through hole 1500*h* of the dummy module 1500 may be disposed to be overlapped with the first fastening hole of the fluid moving part 1100 in the vertical direction. Accordingly, the through hole 1500*h* of the dummy module 1500 and the first fastening hole of the fluid moving part 1100 may be coupled to each other through a fastening member such as a screw.

Meanwhile, according to an embodiment of the present invention, a shield member 1600 may be disposed on at least a portion of the dummy module 1500. In accordance with the above, it is possible to prevent the wires guided along the dummy module 1500 from being exposed to moisture, the second fluid, or contaminants.

The dummy module 1500 may further include a protrusion 1530 protruding toward the adjacent thermoelectric module. A bottom surface of the protrusion 1530 is flush with a lower surface of the dummy module, but a top surface of the protrusion 1530 may form a step with the upper surface of the dummy module 1500. In addition, the second sealing member may be applied to the protrusion 1530 to be sealed between the shield member 1600 and the dummy module 1500. In this specification, the second sealing member means a sealing member extended from a lower portion of an edge of the shield member in the second direction. Furthermore, the second sealing member includes a second-first sealing member SL2*a* and a second-second sealing member SL2*b*, and the second-first sealing member SL2*a* is a sealing member guided by the above-described guide part, and the second-second sealing member SL2*b* means a sealing member at least partially overlapped with the dummy module 1500 in the vertical direction. However, the second sealing member is described in this specification as described above.

The second sealing member SL2 may be disposed on the protrusion 1530. A portion of the second sealing member SL2 as well as the protrusion 1530 may be disposed on the upper surface of the fluid moving part 1100. In addition, the protrusion 1530 may include a protrusion hole for coupling with the shield member, and the shield member and the dummy module may be coupled to each other by a fastening member such as a screw. Furthermore, the second sealing member SL2 may be applied to the protrusion and fastening members to eliminate empty spaces generated during fastening. Accordingly, penetration of the second fluid or other contaminants into the lower portion of the shield member may be suppressed.

In addition, the second sealing member SL2 is extended in the second direction (Y-axis direction) and may be overlapped with the groove part 1100*g* of the fluid moving part 1100 in the vertical direction. Further, the second sealing member SL2 may be disposed between the plurality of groove parts 1100*g* spaced apart from the upper surface of the fluid moving part 1100 in the second direction (Y-axis direction).

Accordingly, the second sealing member SL2 may be in contact with the first sealing member SL1 disposed on the groove part 1100*g* of the fluid moving part 1100. For example, contact or connection between the second sealing member SL2 and the first sealing member SL1 may occur along the edge of the thermoelectric module group or the shield member.

Thus, the first sealing member SL1 and the second sealing member SL2 according to the embodiment may be connected at the above-described positions to form a closed loop to surround the plurality of thermoelectric modules. Accordingly, the second fluid or contaminants may not penetrate into the thermoelectric module through a gap between the shield member 1600 and the fluid moving part 1100. As a result, the reliability of the power generator may be improved.

In addition, the shield member 1600 according to the embodiment may be disposed on the thermoelectric module 1200 and the fluid moving part 1100. The shield member 1600 may include the first part P1, the second part P2, and the stepped part P3 as described above.

The first part P1 is a region overlapped with the thermoelectric module 1200 in the vertical direction, the second part P2 is a region disposed to be offset from the thermoelectric module 1200 and disposed adjacent to the fluid moving part, and the stepped part P3 is a region disposed between the first part P1 and the second part P2. The description thereof may be applied in the same manner as described above.

Furthermore, the first part P1 may include a first-first part P1-1 vertically overlapped with the first region of the thermoelectric module and a first-second part P1-2 vertically overlapped with the second region of the thermoelectric module. The above-described cover member and the first and second connectors may be disposed below the first-second part P1-2.

Further, there is a step difference between the first-second part P1-2 and the first-first part P1-1 for an arrangement space of the cover member or the like, and a height of the first-second part P1-2 from the upper surface of the fluid moving part in the vertical direction may be smaller than a height of the first-first part P1-1 from the upper surface of the fluid moving part in the vertical direction.

In addition, the shield member 1600 may include a plurality of shield holes 1600h disposed in the first part P1. Each of a plurality of heat sinks 1220 may be passed through each of the plurality of shield holes 1600h. The thermoelectric element 1210 and the cover member 1300 may be positioned below the first part P1.

The second part P2 is disposed to be offset from the thermoelectric module 1200 in the vertical direction and may be in contact with one surface of the fluid moving part 1100. That is, the second part P2 may be disposed closer to one surface (for example, upper surface) of the fluid moving part 1100 than the first part P1. For example, a distance between the first part P1 and the upper surface of the fluid moving part 1100 in the vertical direction may be greater than a vertical distance between the second part P2 and the upper surface of the fluid moving part 1100. In addition, the distance between one surface (for example, upper surface) of the fluid moving part 1100 and the shield member 1600 in the vertical direction may be gradually increased from the second part P2 toward the first part P1. Accordingly, the shield member 1600 may protect the fluid moving part 1100 and the thermoelectric element 1210 while minimizing flow resistance of the second fluid.

In addition, the shield member 1600 may further include a support region disposed on the side surface perpendicular to the upper surface of the fluid moving part 1100 extended from the second part P2 in the second and third directions. In accordance with the above, since the shield member 1600 may be disposed on one side of the fluid moving part 1100 in an "¬" shape, a problem in which the position of the shield member 1600 is offset from the upper surface of the fluid moving part 1100 may be prevented, and ease of assembly may be improved.

The stepped part P3 may be disposed between the first part P1 and the second part P2. The stepped part P3 may be in contact with the first part P1 and the second part P2.

In addition, the second part P2 may be positioned outside the thermoelectric module 1200 or the first part P1. For example, the second part P2, the stepped part P3, the first part P1, the stepped part P3, and the second part P2 may be sequentially disposed from the shield member 1600 in the second direction (Y-axis direction).

The shield member 1600 is disposed on the thermoelectric element 1210. In this case, in order for the second fluid to pass through the heat sink 1220, a shield hole 1600h is formed in the shield member 1600, and an edge of the shield hole 1600h is disposed on the second substrate of the thermoelectric element 1210, so that the heat sink 1220 may be exposed through the shield hole 1600h. That is, the edge of the shield hole 1600h is disposed on the second substrate of the thermoelectric element 1210, and the heat sink 1220 may be passed through the shield hole 1600h. In accordance with the above, the inside of the thermoelectric element 1210 may be protected from external contaminants, moisture, and the second fluid, and since the second fluid may be directly passed through the heat sink 1220, heat exchange between the second fluid and the heat sink 1220 may be efficiently performed. In this case, the edge of the shield hole 1600h is disposed on the second substrate of the thermoelectric element 1210, and in order to allow the heat sink 1220 to penetrate the shield hole 1600h, the size of the shield hole 1600h (or, the area on XY) may be smaller than the size of the second substrate of the thermoelectric element 1210 and may be larger than the size of the heat sink 1220, that is, the size of the surface on which the heat sink 1220 is disposed on the second substrate.

Meanwhile, as illustrated, a plurality of thermoelectric elements 1210 may be disposed on the upper surface 1110 of the fluid moving part 1100, and the heat sink 1220 may be disposed on each of the thermoelectric elements 1210. To this end, a plurality of shield holes 1600h are formed in the shield member 1600, and edges of each shield hole 1600h are disposed on the second substrate of each thermoelectric element 1210, so that each heat sink 1220 may be passed through each shield hole 1600h. In accordance with the above, since the plurality of thermoelectric elements 1210 may be covered by using one shield member 1600, the process and structure of assembling the shield member 1600 may be simplified.

According to an embodiment of the present invention, a plurality of additional through-holes may be further formed in the shield member 1600. In this case, the fluid moving part and the shield member 1600 may be fastened through the plurality of through holes.

Throughout this specification, while the thermoelectric elements 100 and 1210 are described as including a first substrate 110, the first electrode 120, the P-type thermoelectric leg 130, the N-type thermoelectric leg 140, the second electrode 150, and the second electrode 150, the definition of the thermoelectric elements 100 and 1210 is not limited thereto. Thus, it may also mean that the thermoelectric elements 100 and 1210 may include the first electrode 120, the P-type thermoelectric leg 130, the N-type thermoelectric leg 140, the second electrode 150, and the second substrate 160, and may be disposed on the first substrate 110.

In addition, throughout this specification, the thermoelectric device 1000 is described as including, but not limited to, the fluid moving part 1100, the thermoelectric module 1200, the cover member 1300, and the shield member 1600, and the thermoelectric module 1200 is described as including, but not limited to, the thermoelectric element 1210 and the heat sink 1220. Thus, it may also mean that the thermoelectric module may include all of the fluid moving part 1100, the thermoelectric element 1210 and the heat sink 1220, the cover member 1300, the shield member 1600.

Figure 29:
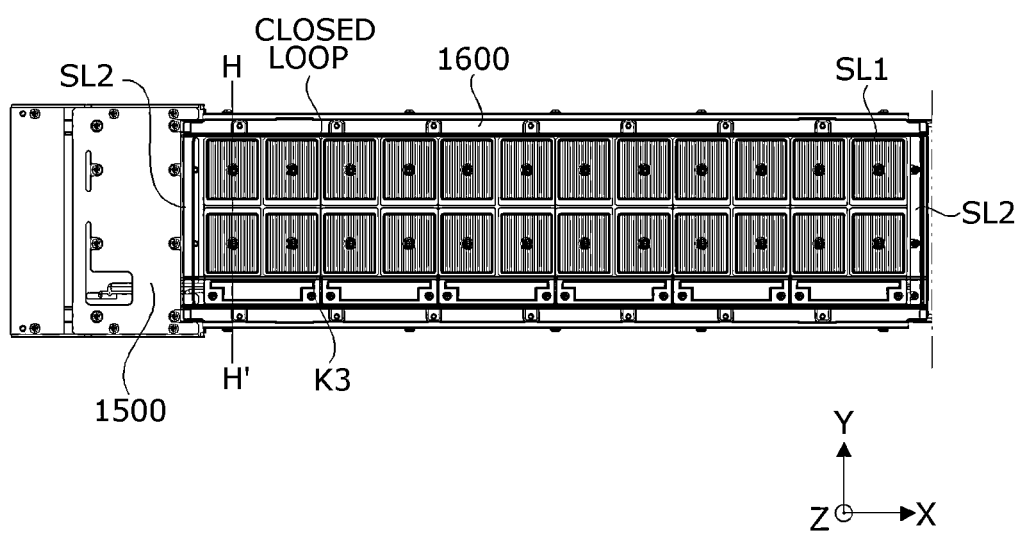
FIG. 29 is a view explaining positions of a first sealing member, a second sealing member, and a third sealing member in a power generator according to an embodiment of the present invention.
Figure 30:
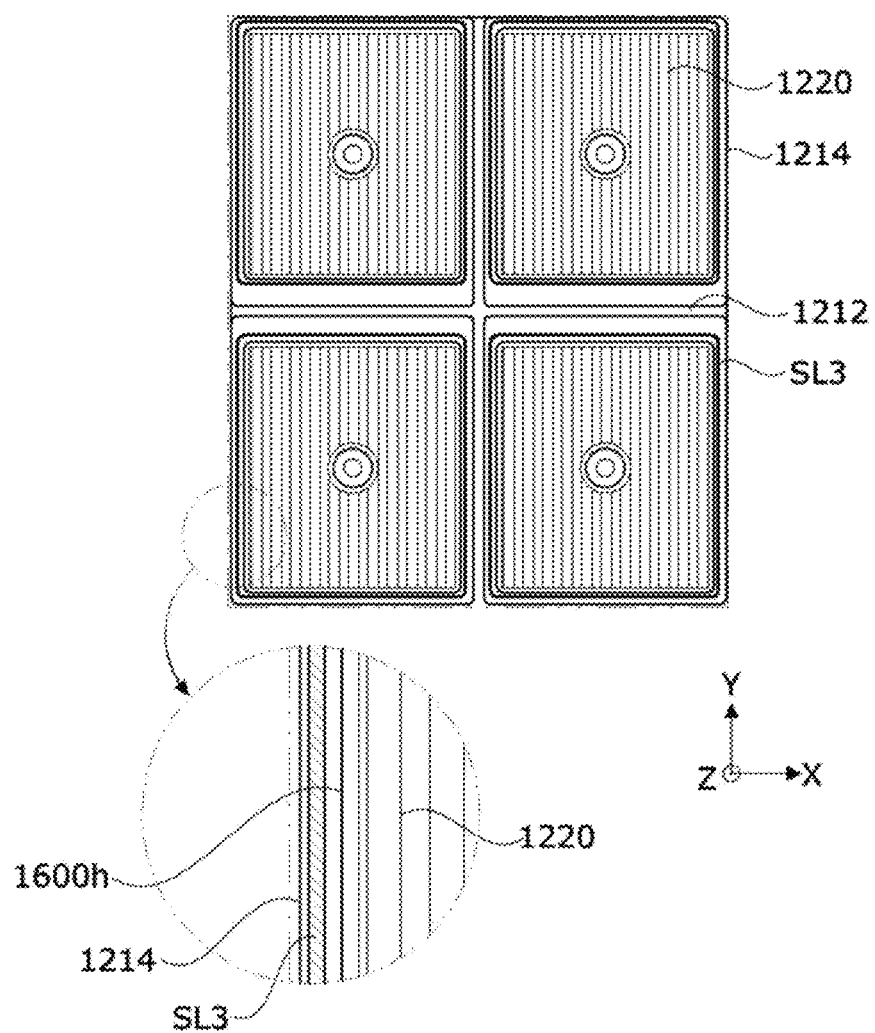
FIG. 30 is an enlarged view of a portion K3 in FIG. 29.

FIG. 29 is a view explaining positions of a first sealing member, a second sealing member, and a third sealing member in a power generator according to an embodiment of the present invention; FIG. 30 is an enlarged view of a portion K3 in FIG. 29; and FIG. 31 is a cross-sectional view taken along a line H-H' in FIG. 29.

Figure 31:
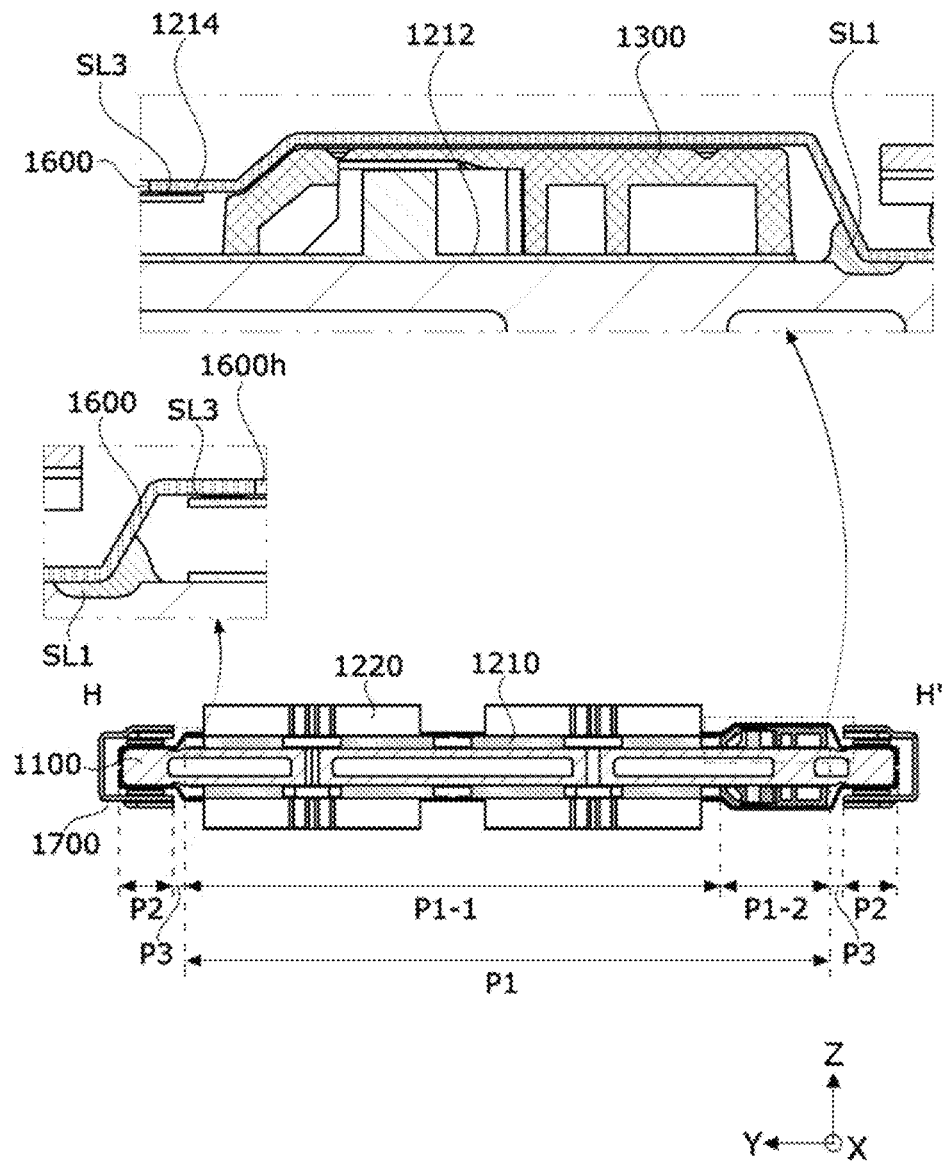
FIG. 31 is a cross-sectional view taken along a line H-H' in FIG. 29.

Referring to FIGS. 29 to 31, the thermoelectric device according to the embodiment may further include a third sealing member SL3 disposed between the thermoelectric element 1210 and the shield member 1600.

First of all, as described above, the shield member 1600 may be disposed on the thermoelectric element 1210 to cover at least a portion of the thermoelectric element 1210. However, in order for the second fluid to pass through the heat sink 1220, a shield hole 1600h may be disposed in the shield member 1600. Further, an edge of the shield hole 1600h is disposed on the second substrate 1214 of the thermoelectric element 1210, and the heat sink 1220 may be exposed through the shield hole 1600h. That is, the edge of the shield hole 1600h is disposed on the second substrate of the thermoelectric element 1210, and the heat sink 1220 may be passed through the shield hole 1600h. Accordingly, heat exchange may be efficiently performed while the second fluid is passed through the heat sink 1220.

Furthermore, the third sealing member SL3 may be disposed between the shield member 1600 and the second substrate 1214 along the edge of the shield hole 1600h. With this configuration, the third sealing member SL3 may protect the inside of the thermoelectric element 1210 from external contaminants, moisture, and the second fluid.

In this case, the edge of the shield hole 1600h is disposed on the second substrate of the thermoelectric element 1210, and in order for the heat sink 1220 to pass through the shield hole 1600h, the size of the shield hole 1600h may be smaller than the size of the second substrate of the thermoelectric element 1210 and may be larger than the size of the heat sink 1220, that is, the size of the surface on which the heat sink 1220 is disposed on the second substrate. For example, the edge of the shield hole 1600h and the heat sink 1220 may be spaced apart in the first direction (X-axis direction) or the second direction (Y-axis direction).

Further, the third sealing member SL3 may be disposed between the edge of the shield hole 1600h and the edge of the second substrate 1214. Thus, the third sealing member SL3 may be overlapped with the first substrate 1212 in the vertical direction. In addition, the third sealing member SL3 may be vertically overlapped with the first part P1 of the shield member 1600, particularly the first-first part P1-1.

In addition, the third sealing member SL3 according to the embodiment may be disposed to be spaced apart from the first sealing member SL1 in the second direction (Y-axis direction). Furthermore, the first sealing member SL1 and the third sealing member SL3 may have a height difference from each other corresponding to the length of the thermoelectric element 1210 in the vertical direction.

As a modified example, the third sealing member SL3 may be extended along the first part P1 and the stepped part P3 to be connected to the first sealing member SL1 below the second part P2. For example, the third sealing member SL3 may be connected to the first sealing member SL1 on the first-first groove. Accordingly, coupling force between the shield member, the thermoelectric module, and the fluid moving part may be improved by coupling the first sealing member and the third sealing member.

The power generation system may generate power through heat sources generated from ships, automobiles, power plants, geothermal heat, and the like, and may arrange a plurality of power generators to efficiently harvest the heat sources. In this case, in each power generator, the cooling performance of the low temperature part of the thermoelectric element may be improved by improving the bonding force between the thermoelectric module and the fluid moving part. Thus, since the efficiency and reliability of the power generator may be improved, the fuel efficiency of transportation devices such as ships or vehicle may be improved. Therefore, in the shipping and transportation industries, transportation costs may be reduced and an eco-friendly industrial environment may be created, and when applied to manufacturing industries such as steel mills, material costs may be reduced.

While the present invention has been mainly described with reference to the preferred embodiments, it should be understood that the present invention is not limited to the disclosed exemplary embodiments, and various modifications and applications may be devised by those skilled in the art to which the present invention pertains without departing from the gist of the present invention.

The invention claimed is:

1. A thermoelectric device comprising:
a fluid moving part;
a thermoelectric module disposed on the fluid moving part;
a guide part disposed on the fluid moving part and spaced apart from the thermoelectric module;
a shield member disposed on the thermoelectric module;
a first sealing member; and
a second sealing member,
wherein a portion of the guide part is overlapped with the shield member in a vertical direction,
wherein the guide part includes a groove part disposed in a region overlapped with the shield member in the vertical direction, a central part, and a support part disposed to be spaced apart from the central part,
wherein the groove part of the guide part is disposed on an upper surface of the support part,
wherein the fluid moving part includes a groove part extending in a first direction,
wherein the first sealing member is disposed on the groove part of the fluid moving part,
wherein the second sealing member is disposed between the guide part and the shield member,
wherein the second sealing member is disposed on the groove part of the guide part, the upper surface of the support part, and a side surface of the central part which is in contact with the upper surface of the support part,
wherein the second sealing member extends to a side surface of the support part inclined between the upper surface of the support part and the groove part of the fluid moving part,
wherein the groove part of the guide part extends in a second direction perpendicular to the first direction, and
wherein the first direction corresponds to a direction in which a plurality of thermoelectric modules or a plurality of shield members are arranged.

2. The thermoelectric device of claim 1, wherein the shield member has the plurality of shield members disposed to be spaced apart from each other in the first direction,
wherein the central part is disposed between the plurality of shield members adjacent to each other, and
wherein the support part is disposed below the plurality of shield members.

3. The thermoelectric device of claim 1, wherein a length of the central part in the second direction is greater than a length of the support part in the second direction.

4. The thermoelectric device of claim 1, wherein the shield member includes a plurality of shield holes,
wherein the thermoelectric module includes:
a thermoelectric element in contact with one surface of the fluid moving part; and
a heat sink disposed on the thermoelectric element, and
wherein the heat sink passes through the plurality of shield holes.

5. The thermoelectric device of claim 4, wherein the shield member includes:
a first part overlapped with the thermoelectric module in the vertical direction;
a second part offset from the thermoelectric module in the vertical direction; and
a stepped part connecting the first part and the second part, and
wherein the second part is closer to one surface of the fluid moving part than the first part.

6. The thermoelectric device of claim 4, further comprising a third sealing member disposed between the thermoelectric module and the shield member,
wherein the third sealing member is spaced apart from the first sealing member.

7. The thermoelectric device of claim 6, wherein the thermoelectric element includes:
a first substrate in contact with the one surface of the fluid moving part;
a second substrate disposed to be spaced apart from the first substrate;
a first electrode disposed on the first substrate;
a second electrode disposed below the second substrate; and
a plurality of thermoelectric legs disposed between the first electrode and the second electrode, and
wherein the third sealing member is disposed between an edge of the second substrate and an edge of a shield hole and overlapped with the first substrate in the vertical direction.

8. The thermoelectric device of claim 7, wherein an area of the shield hole is smaller than an area of the second substrate.

9. A thermoelectric device comprising:
a fluid moving part;
a thermoelectric module disposed on the fluid moving part;
a guide part disposed on the fluid moving part and spaced apart from the thermoelectric module;
a shield member disposed on the thermoelectric module;
a first sealing member; and
a second sealing member,
wherein a portion of the guide part is overlapped with the shield member in a vertical direction,
wherein the guide part includes a groove part disposed in a region overlapped with the shield member in the vertical direction, a central part, and a support part disposed to be spaced apart from the central part,
wherein the groove part of the guide part is disposed on an upper surface of the support part,
wherein the fluid moving part includes a groove part extending in a first direction,
wherein the first sealing member is disposed on the groove part of the fluid moving part,
wherein the second sealing member is disposed between the guide part and the shield member,
wherein the second sealing member is disposed on the groove part of the guide part, the upper surface of the support part, and a side surface of the central part which is in contact with the upper surface of the support part,
wherein the first sealing member is in contact with the second sealing member,
wherein a length of the central part in a second direction is greater than a length between a plurality of groove parts in the second direction, and
wherein at least a portion of the central part is overlapped with the groove part of the fluid moving part in the vertical direction.

10. A thermoelectric device comprising:
a fluid moving part;
a thermoelectric module disposed on the fluid moving part;
a guide part disposed on the fluid moving part and spaced apart from the thermoelectric module;
a shield member disposed on the thermoelectric module;
a first sealing member; and
a second sealing member,
wherein a portion of the guide part is overlapped with the shield member in a vertical direction,
wherein the guide part includes a groove part disposed in a region overlapped with the shield member in the vertical direction, a central part, and a support part disposed to be spaced apart from the central part,
wherein the groove part of the guide part is disposed on an upper surface of the support part,
wherein the fluid moving part includes a groove part extending in a first direction, and the fluid moving part further includes:
wherein the first sealing member is disposed on the groove part of the fluid moving part,
wherein the second sealing member is disposed between the guide part and the shield member, and
wherein the groove part of the guide part is disposed inside the groove part of the fluid moving part.

* * * * *